United States Patent
Gambero et al.

(10) Patent No.: US 12,549,176 B2
(45) Date of Patent: Feb. 10, 2026

(54) INTEGRATABLE VOLTAGE REFERENCE

(71) Applicant: STMicroelectronics International N.V., Geneva (CH)

(72) Inventors: Andrea Gambero, Santo Stefano Ticino (IT); Sandro Rossi, Pavia (IT); Lorenzo Labate, Milan (IT); Simona Angela Cozzi, Legnano (IT); Giulio Ricotti, Broni (IT); Marco Marchesi, Corbetta (IT)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 18/738,840

(22) Filed: Jun. 10, 2024

(65) Prior Publication Data

US 2025/0379574 A1    Dec. 11, 2025

(51) Int. Cl.
    G05F 1/46    (2006.01)
    H03K 17/14    (2006.01)
    H03K 17/30    (2006.01)

(52) U.S. Cl.
    CPC ............. *H03K 17/302* (2013.01); *G05F 1/46* (2013.01); *H03K 17/145* (2013.01); *H03K 2217/0063* (2013.01); *H03K 2217/0072* (2013.01)

(58) Field of Classification Search
    CPC .................................. H03K 17/302; G05F 1/46
    See application file for complete search history.

(56) References Cited

U.S. PATENT DOCUMENTS

| | | | |
|---|---|---|---|
| 6,184,743 B1 | 2/2001 | Swart | |
| 7,968,391 B1 | 6/2011 | Smart et al. | |
| 11,489,441 B2 | 11/2022 | Kaufmann et al. | |
| 2008/0088361 A1 | 4/2008 | Kimura | |
| 2017/0170821 A1 | 6/2017 | Marini et al. | |
| 2020/0007091 A1* | 1/2020 | Li | H10D 84/01 |
| 2021/0335781 A1 | 10/2021 | Arnold et al. | |
| 2022/0392895 A1 | 12/2022 | Rhoades et al. | |

(Continued)

FOREIGN PATENT DOCUMENTS

| | | | |
|---|---|---|---|
| CN | 102023670 B | * | 11/2013 |
| CN | 104345765 B | | 1/2016 |

(Continued)

OTHER PUBLICATIONS

Bimbi, Cesare et al., "Single-Branch Wide-Swing-Cascode Sub-threshold GaN Monolithic Voltage Reference," MDPI, Electronics 2022, 11, 1840, https://doi.org/10.3390/electronics11121840, Published: Jun. 9, 2022, 13 pages.

(Continued)

*Primary Examiner* — Daniel C Puentes
(74) *Attorney, Agent, or Firm* — Slater Matsil LLP

(57) ABSTRACT

An electronic system is disclosed. The system includes a Gallium Nitride (GaN) semiconductor die and further including, entirely disposed on the GaN semiconductor die i) a voltage reference circuit including GaN semiconductor transistors, the voltage reference circuit configured to generate a reference voltage, and ii) an electronic component including GaN semiconductor transistors and configured to generate a power output based on the reference voltage.

20 Claims, 10 Drawing Sheets

(56) References Cited

U.S. PATENT DOCUMENTS

2023/0131602 A1    4/2023    Arnold et al.
2023/0246615 A1    8/2023    Arnold et al.

FOREIGN PATENT DOCUMENTS

| CN | 116260327 A | * | 6/2023 | ............ H02M 1/385 |
|---|---|---|---|---|
| CN | 116470468 A | | 7/2023 | |
| JP | 2008123480 A | | 5/2008 | |

OTHER PUBLICATIONS

Butler, David L. et al., "Low-Voltage Bandgap Reference Design Utilizing Schottky Diodes," IEEE, Published in: 48th Midwest Symposium on Circuits and Systems, 2005, Date of Conference: Aug. 7-10, 2005, Date Added to IEEE Xplore: Feb. 21, 2006, 4 pages.

Chen, Xudong et al., "Design of GaN-based Voltage Reference Circuit for a Wide-Temperature-Range Operation," IEEE, Published in: 2019 International Conference on IC Design and Technology (ICICDT), Date of Conference: Jun. 17-19, 2019, Date Added to IEEE Xplore: Aug. 8, 2019, 4 pages.

Cordova, David et al., "0.5 V Supply Voltage Reference Based on the MOSFET ZTC Condition," ResearchGate, Sep. 2015, 8 pages.

Li, Ziqian et al., "A 5 to 50 V, -25 to 225° C, 0.065%/° C GaN MISHEMT Monolithic Compact 2T Voltage Reference," 2022 IEEE 9th Workshop on Wide Bandgap Power Devices & Applications (WiPDA), DOI: 10.1109/WiPDA56483.2022.9955269, Date of Conference: Nov. 7-9, 2022, 4 pages.

Extended European search report, Eureopean Application No. 25177638.1, mailed Oct. 27, 2025, 10 pages.

Han Di et al., "Efficiency characterization and thermal study of GaN based 1 κW inverter," 2014 IEEE Applied Power Electronics Conference and Exposition—APEC 2014, IEEE, Mar. 16, 2014, 7 pages.

* cited by examiner

INTEGRATABLE VOLTAGE REFERENCE

TECHNICAL FIELD

The present disclosure generally relates to a voltage reference generator, as well as to voltage reference generators which may be integrated with other circuits.

BACKGROUND

Some analog processing systems use a number of voltage generators to generate voltages for the system to operate. For example, a DC/DC converter system may need a number of power or reference voltages, and a set of voltage regulators may be used to generate the needed power and reference voltages based on a voltage reference from a voltage reference generator.

SUMMARY

One embodiment is an electronic system, including a Gallium Nitride (GaN) semiconductor die and further including, entirely disposed on the GaN semiconductor die i) a voltage reference circuit including GaN semiconductor transistors, the voltage reference circuit configured to generate a reference voltage, and ii) an electronic component including GaN semiconductor transistors and configured to generate a power output based on the reference voltage, where the voltage reference circuit includes an amplifier including GaN semiconductor transistors, the amplifier including a first and a second input terminal and an output terminal; a feedback stage including a first tract including a first GaN HEMT including a respective gate, source, and drain terminal, where the first GaN HEMT is connected to the first input terminal of the amplifier; a second tract including a resistor connected, at a first end of the resistor, to the second input terminal of the amplifier; and a second GaN HEMT including a respective gate, source and drain terminal, where the second HEMT is connected to a second end of the resistor, where the second HEMT has an area which is Q times a respective area of the first HEMT, where Q is greater than 1, where the first and second tracts are configured to respectively generate a first and second voltage at the first and second input terminal of the amplifier, respectively, where the amplifier is configured to generate, at the output terminal, an amplifier voltage based on the first and second voltages, where the feedback stage is configured to generate the reference voltage based on the amplifier voltage, and where the reference voltage is a function of the area of the first and second HEMTs and a value of the resistor.

Another embodiment is a method of forming an electronic system, the method including providing a Gallium Nitride (GaN) semiconductor die; forming a voltage reference circuit including GaN semiconductor transistors on the GaN semiconductor die, the voltage reference circuit configured to generate a reference voltage, and forming an electronic component including GaN semiconductor transistors on the GaN semiconductor die, the electronic component configured to generate a power output based on the reference voltage, where the voltage reference circuit includes an amplifier including GaN semiconductor transistors, the amplifier including a first and a second input terminal and an output terminal; a feedback stage including a first tract including a first GaN HEMT including a respective gate, source, and drain terminal, where the first GaN HEMT is connected to the first input terminal of the amplifier; a second tract including a resistor connected, at a first end of the resistor, to the second input terminal of the amplifier; and a second GaN HEMT including a respective gate, source and drain terminal, where the second HEMT is connected to a second end of the resistor, where the second HEMT has an area which is Q times a respective area of the first HEMT, where Q is greater than 1, where the first and second tracts are configured to respectively generate a first and second voltage at the first and second input terminal of the amplifier, respectively, where the amplifier is configured to generate, at the output terminal, an amplifier voltage based on the first and second voltages, where the feedback stage is configured to generate the reference voltage based on the amplifier voltage, and where the reference voltage is a function of the area of the first and second HEMTs and a value of the resistor.

Another embodiment is an electronic system, including a Gallium Nitride (GaN) semiconductor die and further including, entirely disposed on the GaN semiconductor die a voltage reference circuit including GaN semiconductor transistors, the voltage reference circuit configured to generate a reference voltage, and the voltage reference circuit including an amplifier including GaN semiconductor transistors, the amplifier including a first and a second input terminal and an output terminal; a feedback stage including a first tract including a first GaN HEMT including a respective gate, source, and drain terminal, where the first GaN HEMT is connected to the first input terminal of the amplifier; a second tract including a resistor connected, at a first end of the resistor, to the second input terminal of the amplifier; and a second GaN HEMT including a respective gate, source and drain terminal, where the second HEMT is connected to a second end of the resistor, where the second HEMT has an area which is Q times a respective area of the first HEMT, where Q is greater than 1, where the first and second tracts are configured to respectively generate a first and second voltage at the first and second input terminal of the amplifier, respectively, where the amplifier is configured to generate, at the output terminal, an amplifier voltage based on the first and second voltages, where the feedback stage is configured to generate the reference voltage based on the amplifier voltage, and where the reference voltage is a function of the area of the first and second HEMTs and a value of the resistor.

BRIEF DESCRIPTION OF THE DRAWINGS

For a more complete understanding of one or more embodiments of the present disclosure, and the advantages thereof, reference is now made to the following descriptions taken in conjunction with the accompanying drawings, in which.

Figure 1:
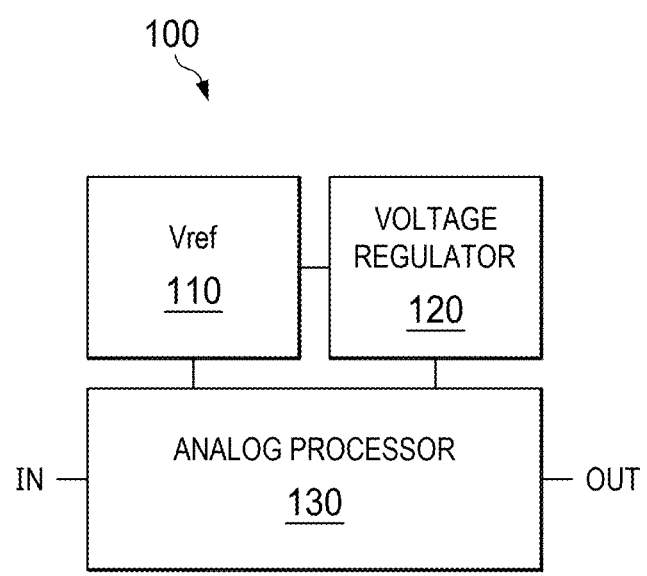
FIG. 1 shows a schematic circuit block diagram of an electronic system according to some embodiments.

Corresponding numerals and symbols in the different figures generally refer to corresponding parts unless otherwise indicated. The figures are drawn to illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

Illustrative embodiments of the system and method of the present disclosure are described below. In the interest of clarity, all features of an actual implementation may not be described in this specification. It will of course be appreciated that in the development of any such actual embodiment, numerous implementation-specific decisions may be made to achieve the developer's specific goals, such as compliance with system-related and business-related constraints, which will vary from one implementation to another. Moreover, it should be appreciated that such a development effort might be complex and time-consuming but would nevertheless be a routine undertaking for those of ordinary skill in the art having the benefit of this disclosure.

Reference may be made herein to the spatial relationships between various components and to the spatial orientation of various aspects of components as the devices are depicted in the attached drawings. However, as will be recognized by those skilled in the art after a complete reading of the present disclosure, the devices, members, apparatuses, etc. described herein may be positioned in any desired orientation. Thus, the use of terms such as "above," "below," "upper," "lower," or other like terms to describe a spatial relationship between various components or to describe the spatial orientation of aspects of such components should be understood to describe a relative relationship between the components or a spatial orientation of aspects of such components, respectively, as the device described herein may be oriented in any desired direction.

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

In some embodiments, it is possible to integrate an integratable voltage reference circuit which is stable across process, voltage, and temperature variations with other circuits on a single semiconductor die. For example, some semiconductor manufacturing processes are able to feasibly manufacture transistors which are of the same conductivity type. For example, III-V semiconductor processes, such as GaN, are able to feasibly manufacture N-type transistors. Accordingly, GaN semiconductor processes do not offer P-type transistors for manufacturing.

Therefore, semiconductor circuits using only those feasibly manufactured conductivity type transistors are desirable.

In some embodiments, voltage reference generator circuits which are stable across process, voltage, and temperature variations are disposed using transistors which are all of the same conductivity type. For example, the embodiments disclosed herein include voltage reference generator circuits having transistors which are only N-type.

As a result, the process, voltage, and temperature stable voltage reference generator circuits discussed herein may be integrated with other circuits which also include transistors which are only N-type. Consequently, the voltage reference generator circuits discussed herein may be integrated with other circuits using, for example, a GaN semiconductor technology.

Some conventional systems do not integrate process, voltage, and temperature stable voltage reference generator circuits. Accordingly, these conventional systems use process, voltage, and temperature stable voltage reference generator circuits which are external, and are not integrated on the same die. The solutions increase area, complexity, and cost.

Some conventional systems integrate voltage reference generators which are not process, voltage, and temperature stable. Accordingly, these conventional systems use voltage reference generator circuits which are internal, but are not process, voltage, and temperature stable. The solutions generally increase die area, complexity, power, and cost. In addition, these systems suffer from all of the effects of having unstable reference voltages, such as poor performance.

Embodiments discussed herein use a Schottky diode at the gate of process-native transistors to form a process, voltage, and temperature stable voltage reference. The generated voltage reference has a value related to physical constant (e.g., energy gap of a metal-semiconductor junction) and not on process dependent characteristics.

Some embodiments are compatible with GaN monolithic technology. In some embodiments, all transistors are either e-HEMTs (enhancement mode high electron mobility transistors) or d-HEMTs (depletion mode high electron mobility transistors).

Some embodiments have good load regulation and power supply rejection ratio because they include a closed loop solution and are isolated from power supply by high-impedance current-generator components.

In GaN technology, some solutions of voltage references have been proposed, but they are based on absolute parameter values, such as HEMT thresholds, and are, accordingly, very sensitive to process variations. Also, the temperature stability of these references is very poor, for example, in the order of hundreds of ppm/K.

Embodiments discussed herein take advantage of metal-semiconductor junctions in gates of GaN d-HEMTs. Based on two metal-semiconductor junctions biased at different current densities, embodiments formed in GaN monolithic technology are disclosed. Some embodiments generate a voltage reference related to a physical constant (energy barrier gap).

Some embodiments generate a voltage reference having a temperature variability which is less than 100 ppm/K in a temperature range going from −40 C to 175 C. The embodiments also have good performances in term of load regulation and power supply rejection ratio.

The embodiments presented herein are so innovative, that current simulation models do not properly describe the functionality of the HEMT gate Schottky diodes. The most current model available for high electron mobility transistors (GaN HEMT) is called ASM-HEMT, which is still under development at the Compact Modelling Coalition (CMC). It is a physics-based compact model which describes both radio frequency and power electronics applications, and considers each operating region of the transistors. For gate Schottky diode modelling, we observed a lack of accuracy and discrepancies between measurements of fabricated devices and model-based simulations both in terms of size scalability and thermal behaviour. To improve simulation conformity with device measurements, the equations of the ASM model were modified to fit the thermal behaviour of the gate Schottky diode observed measurements.

FIG. 1 shows a schematic circuit block diagram of an electronic system 100 according to some embodiments. Electronic system 100 includes voltage reference generator 110, voltage regulator 120, and analog circuit 130.

Analog circuit 130 receives one or more input signals, processes the input signals, and generates output signals based on the processed input signals. For example, in some embodiments, analog circuit 130 includes at least one of a converter circuit, an amplifier circuit, or one or more other analog circuits. In order to generate the output signals, analog circuit 130 receives one or more voltage reference signals and/or one or more power signals.

Voltage regulator 120 and voltage reference generator 110 collectively generate the voltage reference signals and the power signals for analog circuit 130. For example, voltage reference generator 110 may be configured to generate one or more reference voltages. In addition, voltage regulator 120 may be configured to receive the reference voltages, and to generate one or more voltage reference signals and/or one or more power signals for analog circuit 130.

Voltage reference generator 110 generates a reference voltage which is stable across variations in certain performance influencing aspects, which may include one or more of manufacturing processing, system power voltage, and circuit temperature. Example embodiments of voltage reference generator 110 are described in more detail elsewhere herein.

Voltage regulator 120 is configured to generate the one or more voltage reference signals and/or one or more power signals using one or more known architectures. For example, voltage regulator 120 may include one or more amplifiers, DC-DC converters, low dropout (LDO) regulators, or other known architectures configured to generate voltage reference signals and or power signals.

In some embodiments, voltage reference generator 110, voltage regulator 120, and analog circuit 130 are formed on a single semiconductor die. The die may be manufactured as one of a large number of dies formed with a semiconductor manufacturing process on a single semiconductor wafer.

In some embodiments, the semiconductor manufacturing process is able to manufacture transistors which are of the same conductivity type. For example, at least some III-V semiconductor processes, such as GaN, semiconductor processes may be able to feasibly manufacture N-type transistors, and may not feasibly manufacture P-type transistors. In some embodiments, the semiconductor manufacturing process does not manufacture P-type transistors.

Accordingly, the transistors used to form voltage reference generator 110, voltage regulator 120, and analog circuit 130 may be all of the same conductivity type. For example, the transistors used to form voltage reference generator 110, voltage regulator 120, and analog circuit 130 may be all N-type transistors. In some embodiments, all of the transistors used to form voltage reference generator 110, voltage regulator 120, and analog circuit 130 are GaN N-type transistors. In some embodiments, all of the transistors used to form voltage reference generator 110, voltage regulator 120, and analog circuit 130 are GaN N-type HEMT transistors.

Figure 2:
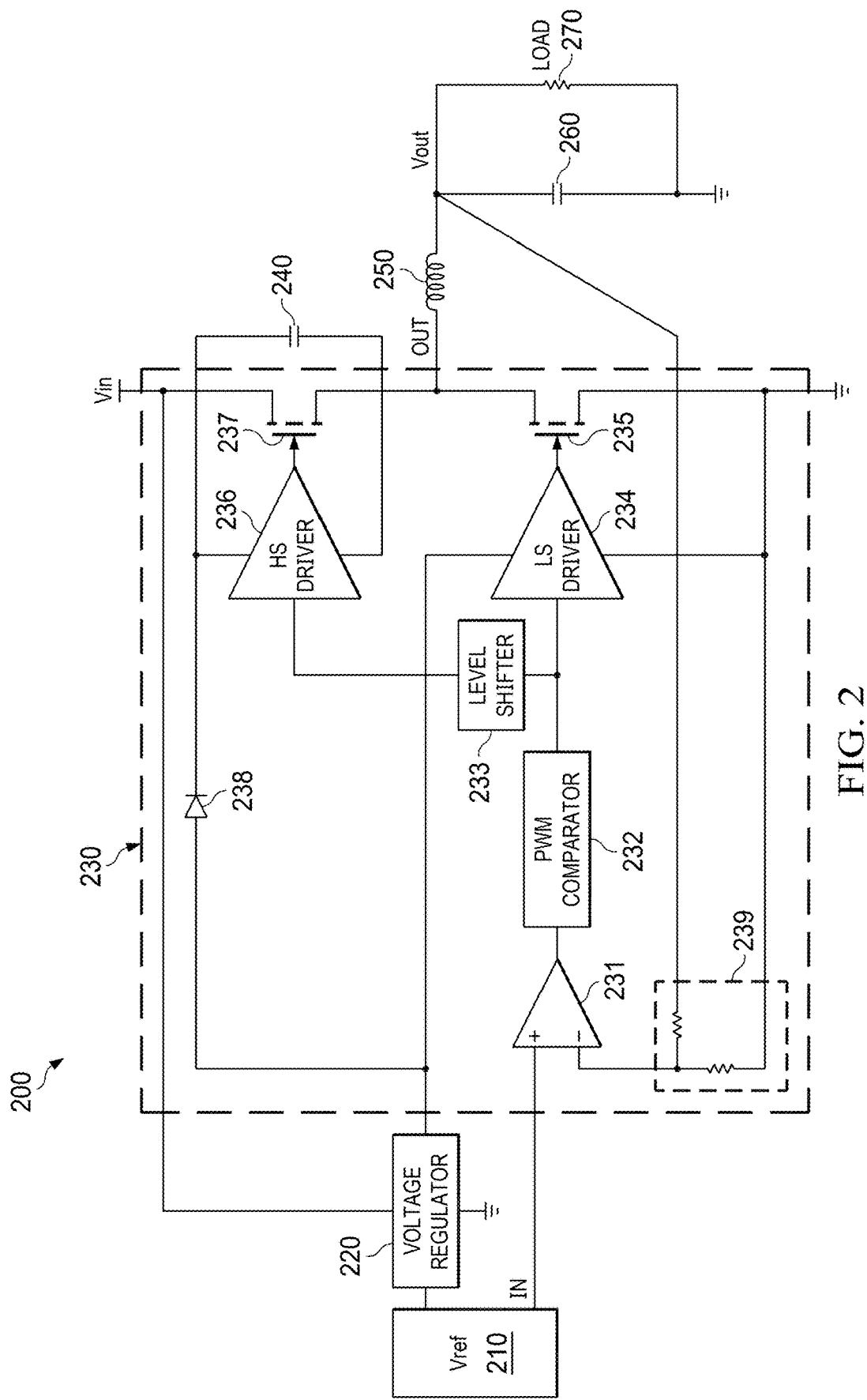
FIG. 2 shows a schematic circuit block diagram of a DC/DC converter system according to some embodiments.

FIG. 2 shows a schematic circuit block diagram of an electronic system 200 according to some embodiments. Electronic system 200 includes voltage reference generator 210, voltage regulator 220, and analog circuit, which, in this embodiment, is a DC-DC converter 230.

DC-DC converter 230 receives an input signal from voltage reference generator 210, processes the input signal, and generates output signals based on the processed input signal. In order to generate the output signals, DC-DC converter 230 receives power signals from voltage regulator 220.

Voltage regulator 220 generates the power signals for DC-DC converter 230 based on a reference voltage from voltage reference generator 210. In this embodiment, voltage reference generator 210 is configured to generate a reference voltage for voltage regulator 220. In addition, in this embodiment, voltage regulator 220 is configured to receive the reference voltage from voltage reference generator 210, and to generate the power signals for DC-DC converter 230 based on the reference voltage received from voltage reference generator 210.

Voltage reference generator 210 generates a reference voltage which is stable across variations in certain performance influencing aspects, which may include one or more of manufacturing processing, system power voltage, and circuit temperature. Example embodiments of voltage reference generator 210 are described in more detail elsewhere herein.

Voltage regulator 220 is configured to generate the power signals for DC-DC converter 230 using one or more known architectures. For example, voltage regulator 220 may include an LDO, such as a GaN based LDO.

In some embodiments, voltage reference generator 210, voltage regulator 220, and DC-DC converter 230 are formed on a single semiconductor die manufactured as one of a large number of dies formed with a semiconductor manufacturing process on a single semiconductor wafer. In some embodiments, the semiconductor manufacturing process is constrained to manufacture transistors which are of the same conductivity type. For example, at least some III-V semiconductor processes, such as GaN, semiconductor processes may be able to feasibly manufacture N-type transistors, and may not feasibly manufacture P-type transistors. In some embodiments, the semiconductor manufacturing process does not manufacture P-type transistors.

Accordingly, the transistors used to form voltage reference generator 210, voltage regulator 220, and DC-DC converter 230 may be all of the same conductivity type. For example, the transistors used to form voltage reference generator 210, voltage regulator 220, and DC-DC converter 230 may be all N-type transistors. In some embodiments, all of the transistors used to form voltage reference generator 210, voltage regulator 220, and DC-DC converter 230 are GaN N-type transistors. In some embodiments, all of the transistors used to form voltage reference generator 210, voltage regulator 220, and DC-DC converter 230 are GaN N-type HEMT transistors.

In this embodiment, DC-DC converter 230 includes amplifier 231, PWM (pulse width modulation) converter 232, level shifter 233, low side driver 234, low side power device 235, high side driver 236, high side power device 237, and power rectifier 238. In alternative embodiments, other architectures are used.

Amplifier 231 is configured to receive a reference voltage generated by voltage reference generator 210 at its positive input terminal, and to receive a feedback signal at its negative input terminal. The feedback signal is generated by resistor divider 239 based on the output voltage Vout. Amplifier 231 is also configured to generate an amplified difference signal based on a difference between the received reference voltage and the received feedback signal.

PWM comparator 232 is configured to receive the amplified difference signal from amplifier 231 and to generate a PWM switching signal having a duty cycle corresponding with the amplified difference signal.

Low side driver 234 is configured to receive the PWM switching signal and to cause low side power device 235 to be selectively conductive according to the PWM switching signal.

Level shifter 233 is configured to receive the PWM switching signal from PWM comparator 232, and to generate a high side PWM signal for high side driver 236, which receives positive and negative power signals because of bootstrapping power rectifier 238, and bootstrap capacitor 240.

High side driver 236 is configured to receive the high side PWM signal and to cause high side power device 237 to be selectively conductive according to the high side PWM switching signal.

In some embodiments, level shifter 233 is configured to generate the high side PWM signal such that high side power device 237 and low side power device 235 are not simultaneously conductive.

PWM comparator 232 is configured to generate the PWM switching signal to cause high side power device 237 and low side power device 235 to alternately source current to and sink current from inductor 250 such that the output voltage Vout across capacitor 260 and load 270 matches that needed to generate the feedback signal at the negative input terminal of amplifier 231 matches the reference voltage at the positive input terminal of amplifier 231, according to the gain of the feedback loop.

Figure 3:
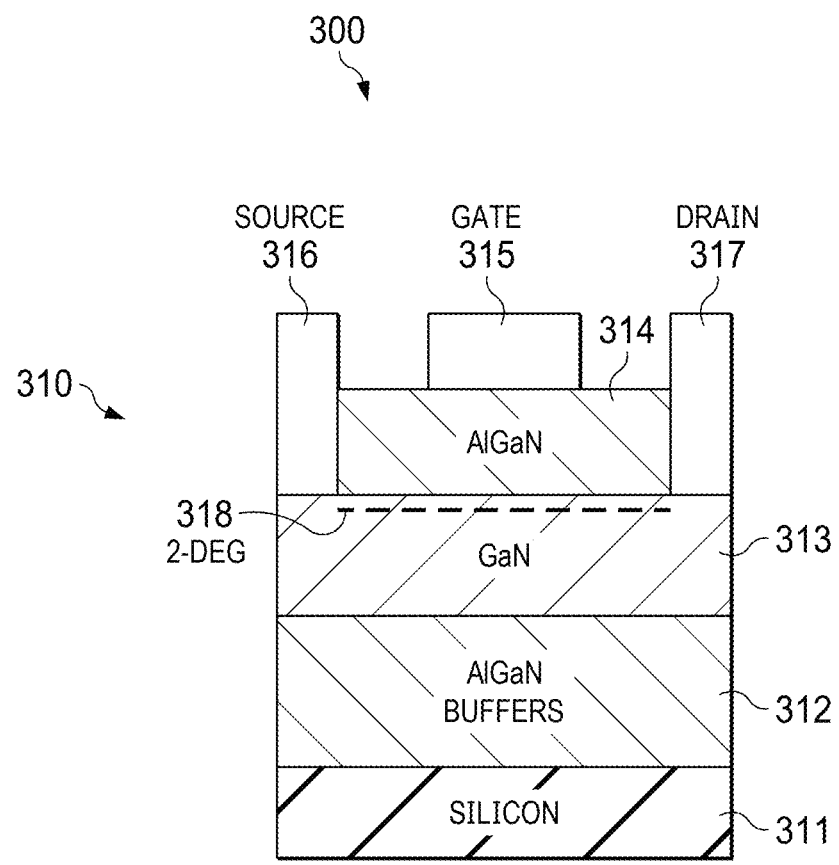
FIG. 3 shows a schematic diagram of a diode according to some embodiments.
Figure 3:
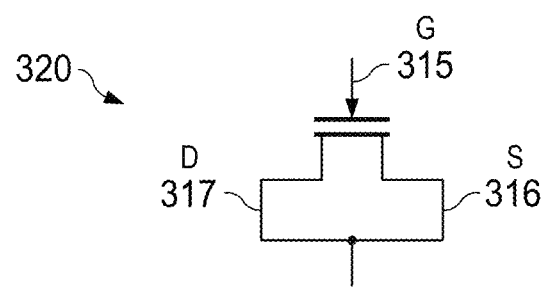
Figure 3:
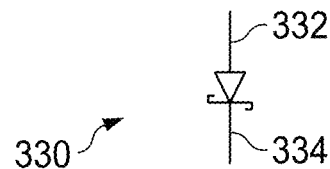

FIG. 3 shows a schematic diagram of different representations 310, 320, and 330, of a diode 300 according to some embodiments. In this embodiment diode 300 is a Schottky diode at the gate of the GaN depletion HEMT transistors formed by the GaN manufacturing technology.

Representation 310 is a cross-sectional view of Schottky diode 300 illustrating layers formed during manufacturing.

In this embodiment, an AlGaN buffer layer 312 is formed on silicon substrate 311. AlGaN buffer layer 312 bonds to silicon substrate 311 and presents a lattice structure for GaN layer 313 sufficient for GaN layer 313 to be epitaxial a grown on AlGaN buffer layer 312.

AlGaN layer 314 is formed on GaN layer 313 such that 2DEG (2-dimensional electron gas) layer forms at the junction between AlGaN layer 314 and GaN layer 313 without a voltage bias across the junction.

Gate terminal 315 is formed on AlGaN layer 314 and provides an electrical contact to AlGaN layer 314.

Source terminal 316 and drain terminal 317 are formed so as to provide electrical contacts to GaN layer 313. In addition, source terminal 316 and drain terminal 317 are electrically shorted in a one or more cross-sectional planes not illustrated.

The gate 315 of the HEMT and the AlGaN layer 314 form a metal-semiconductor junction Schottky diode where the gate 315 is the anode and the shorted drain and source 317 and 316 are the cathode. By forwarding bias the Schottky diode 300, current enters the gate 315, flows through the metal-semiconductor junction and is collected by the source and drain terminals 316 and 317 through the 2-DEG electron gas 318.

In alternative embodiments, a metal-semiconductor junction is formed with a metal structure other than a gate of a HEMT, and an AlGaN layer.

The representation 320 is a schematic transistor representation of Schottky diode 300. Representation 320 shows the electrically shorted drain and source terminals 317 and 316.

The representation 330 is a schematic Schottky diode representation of Schottky diode 300. The anode 332 corresponds with the gate terminal 315 of representations 320 and 310. The cathode 334 corresponds with the drain and source terminals 317 and 316 of representations 320 and 310.

Figure 4:
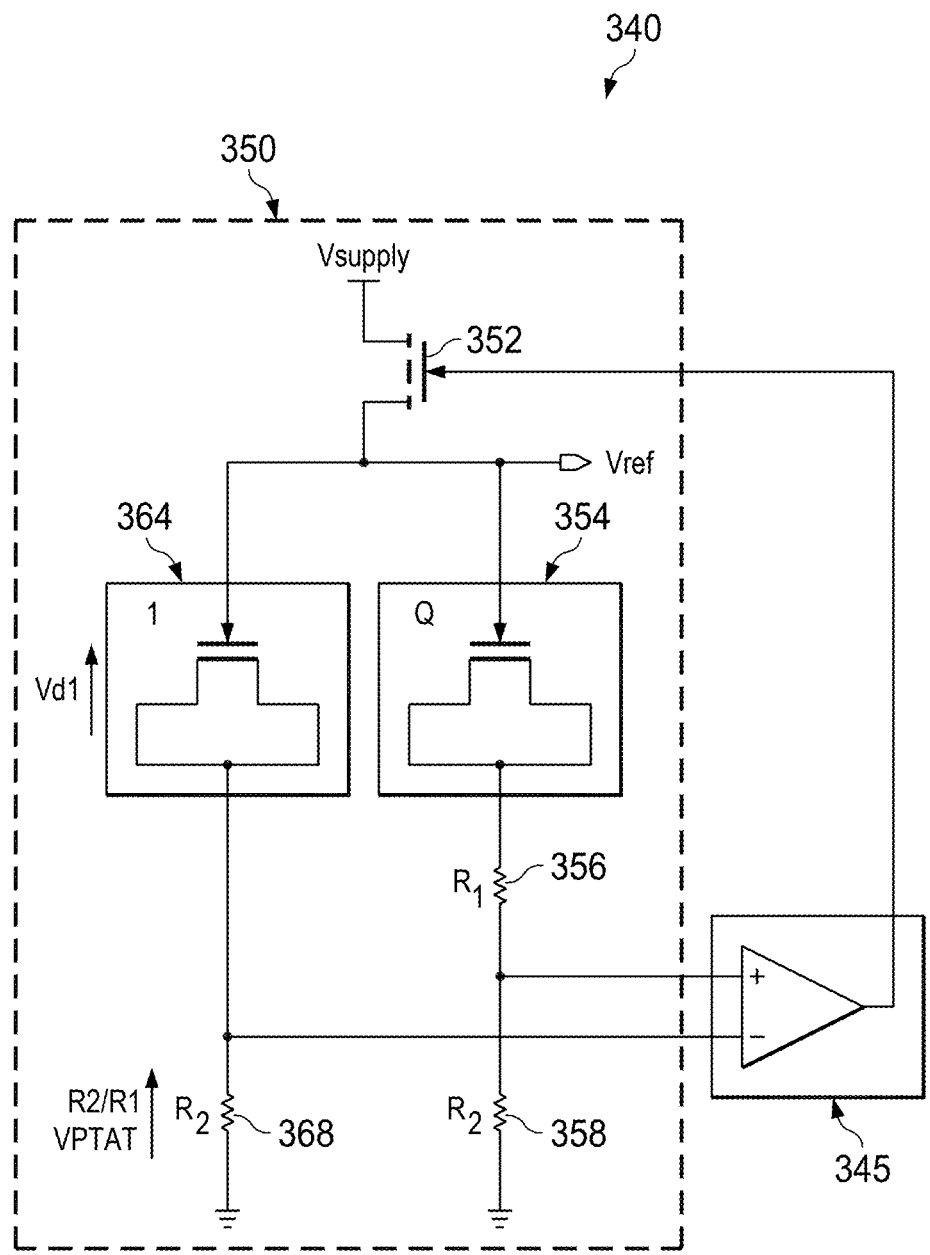
FIG. 4 shows a schematic diagram of an integratable voltage reference generator according to some embodiments.

FIG. 4 shows a schematic diagram of an integratable voltage reference generator 340 according to some embodiments. Voltage reference generator 340 includes amplifier 345, and feedback stage 350, which collectively form a feedback loop which causes the voltages and currents of voltage reference generator 340 to generate an output voltage Vref which is stable across variations in certain performance influencing aspects, which may include one or more of manufacturing processing, system power voltage, and circuit temperature.

Amplifier 345 is configured to receive a differential voltage at across its inputs and to generate a feedback signal for feedback stage 350 corresponding with the difference between the input voltages. The voltage of the feedback signal corresponds with the voltage necessary for the feedback stage 350 to generate voltages at the input of amplifier 345 which cause the amplifier 345 to generate the feedback signal voltage. In some embodiments, amplifier is a single stage amplifier. In some embodiments, amplifier is a two-stage amplifier. In some embodiments, amplifier 345 is a three or more-stage amplifier.

Feedback stage 350 includes current source transistor 352, a first tract comprising small area Schottky diode 364 and resistor 368, and a second tract comprising large area Schottky diode 354, resistor 356, and resistor 358.

Current source transistor 352 receives the feedback voltage from amplifier 345 and provides a first current to resistor 358 through large area Schottky diode 354 and resistor 356, and provides a second current to resistor 368 through small area Schottky diode 364.

Resistor 358 generates a voltage at the positive input terminal of amplifier 345. Similarly, resistor 368 generates a voltage at the negative input terminal of amplifier 345.

The difference in the voltages at the positive and negative input terminals of amplifier 345 forms a differential feedback signal, and is dependent on the gain of the feedback loop formed by amplifier 345 and feedback stage 350. For the following analysis of the functionality of voltage reference generator 340, the difference in the voltages at the positive and negative inputs terminals of amplifier 345 is considered negligible.

Accordingly, the voltage drop across resistor 358 is equal to the voltage drop across resistor 368. Additionally, the voltage drop Vd1 across small area Schottky diode 364 is equal to the sum of the voltage drops across large area Schottky diode 354 and resistor 356.

The voltage across resistor 356 (VR1) is equal to the voltage across small area Schottky diode 364 (Vd1) minus the voltage across large area Schottky diode 354 (VdQ). In addition, $$VR1 = Vd1 - VdQ = nV_t \ln(Q), \text{ where:}$$

n is the ideality factor of the metal-semiconductor junction, $V_t$ is the thermal voltage equal to KT/q, and Q is the area ratio of large area Schottky diode 354 to small area Schottky diode 364.

Furthermore, the current through resistor 358 and resistor 356 is (Vref−Vd1)/R2.

Accordingly, the voltage across resistor 356 (VR1) is R1×(Vref−Vd1)/R2 and is $nV_t \ln(Q)$.

Therefore, Vref=Vd1+R2/R1×$nV_t \ln(Q)$

The ratio R2/R1 may be called γ, and may be designed to stabilize Vref against temperature variations, and $nV_t \ln(Q)$ may be called $V_{PTAT}$, because it is proportional to absolute temperature.

Accordingly, the reference voltage Vref is stable across variations in certain performance influencing aspects, which may include one or more of manufacturing processing, system power voltage, and circuit temperature.

In some embodiments, resistors 358 and 368 are trimmed in a manufacturing process to more precisely control the resistance value R2.

In some embodiments, the semiconductor manufacturing process used to make voltage reference generator 340 is limited to manufacturing transistors which are of the same conductivity type. For example, at least some III-V semiconductor processes, such as GaN, semiconductor processes may be able to feasibly manufacture N-type transistors, and may not feasibly manufacture P-type transistors. In some embodiments, the semiconductor manufacturing process does not manufacture P-type transistors.

Accordingly, the transistors used to form voltage reference generator 340 may be all of the same conductivity type. For example, the transistors used to form voltage reference generator 340 may be all N-type transistors. In some embodiments, all of the transistors used to form voltage reference generator 400 are GaN N-type transistors. In some embodiments, all of the transistors used to form voltage reference generator 340 are GaN N-type HEMT transistors.

Figure 5:
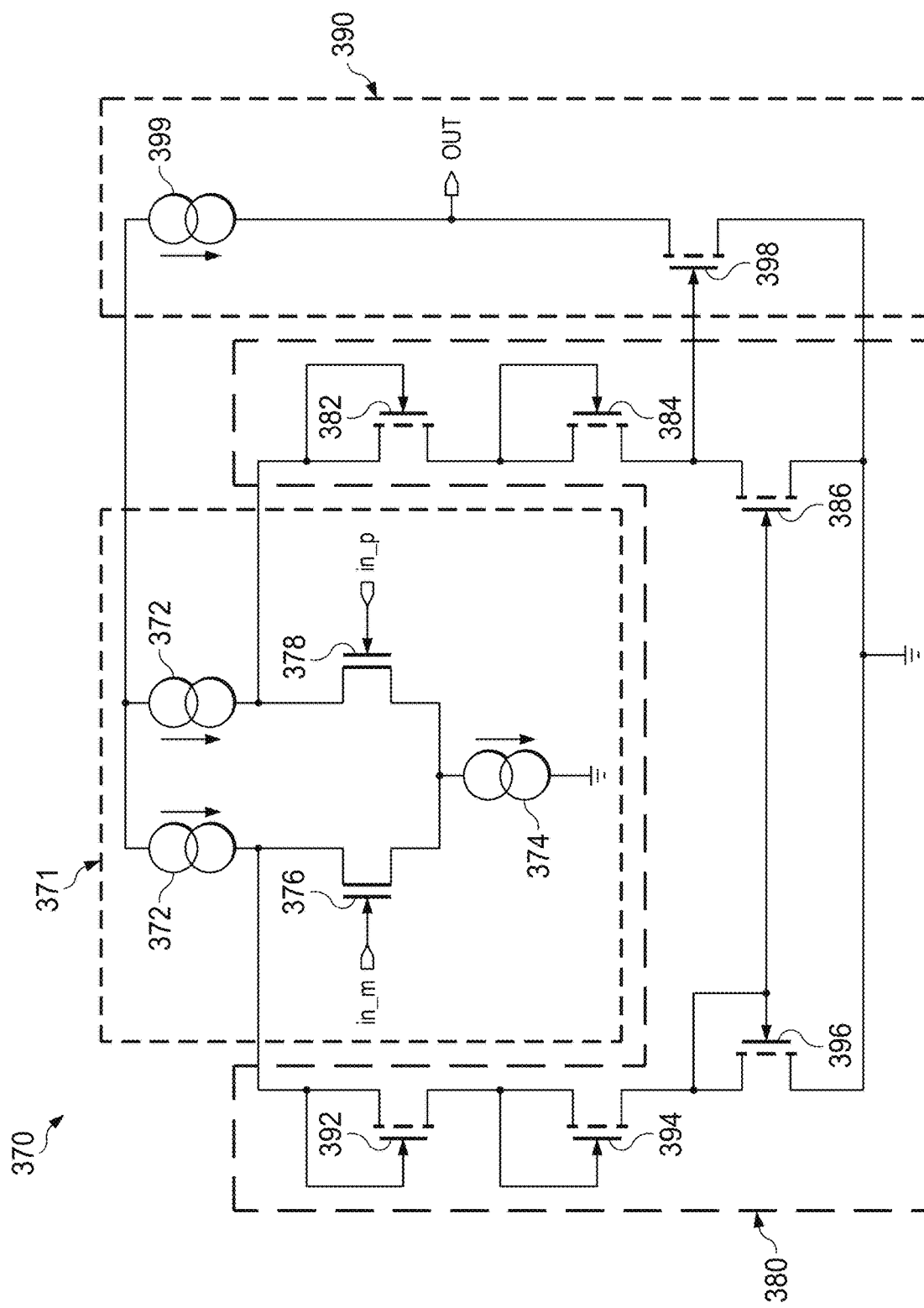
FIG. 5 shows a schematic diagram of an integratable amplifier according to some embodiments.

FIG. 5 shows a schematic diagram of an amplifier 370, which may be used, for example, as amplifier 345. Amplifier 370 includes first stage 371, second stage 380, and third stage 390.

First stage 420 includes an amplifier having tail current source 374, differential pair transistors 376 and 378, and load current sources 372. First stage 371 is configured to receive a differential voltage at the gates of differential pair transistors 376 and 378. In addition, first stage 371 is configured to generate a differential current signal for second stage 380 corresponding with the difference between the voltages at the gates of the differential pair transistors 376 and 378.

Second stage 380 includes a first series of diodes 392 and 394, diode connected transistor 396, transistor 386, and second series of diodes 382 and 384.

The first series of Schottky diodes 392 and 394 are configured to receive one current signal of the differential current signal generated by first stage 371. First series of Schottky diodes 392 and 394 conducts the received current signal to diode connected transistor 396. The first series of Schottky diodes 392 and 394 also provide a voltage level shift between diode connected transistor 396 and the output of first stage 371.

Diode connected transistor 396 generates a current mirror voltage corresponding with the current signal received from first series of Schottky diodes 392 and 394. In some embodiments, diode connected transistor 396 is cascoded with another transistor (not shown).

Transistor 386 receives the current mirror voltage at its gate and conducts a current corresponding with the current mirror voltage.

The second series of Schottky diodes 382 and 384 are configured to receive the other current signal of the differential current signal generated by first stage 371. Second series of Schottky diodes 382 and 384 conducts the received current signal to transistor 386. The first series of Schottky diodes 392 and 394 also provide a voltage level shift between transistor 386 and the output of first stage 371.

Any difference in the current conducted by transistor 386 and the current conducted by the second series of Schottky diodes 382 and 384 causes the voltage at the drain of transistor 386 to change toward a voltage where the feedback loop causes the current conducted by transistor 386 to be equal to the current conducted by the second series of Schottky diodes 382 and 384.

Third stage 390 includes transistor 398 and load current source 399.

Transistor 398 receives the voltage at the drain of transistor 386 at its gate, and conducts a current corresponding with the received voltage. In addition, transistor 398 receives the current generated by load current source 399. The feedback loop causes the voltage at the gate of transistor 398 to cause the current conducted by transistor 398 to be equal to the current generated by load current source 399. In addition, load current source 399 and transistor 398 collectively generate an output voltage at node out.

Figure 6:
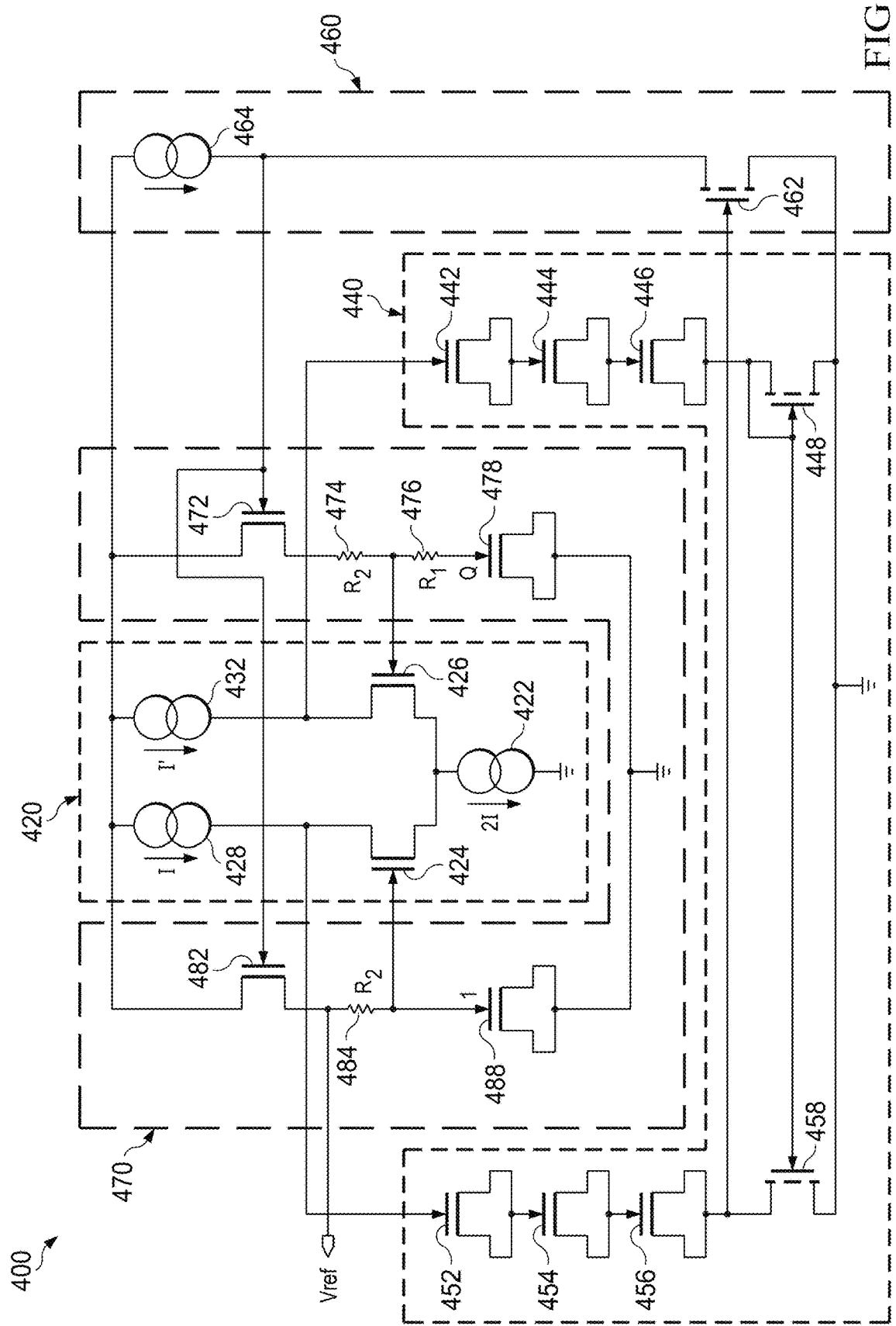
FIG. 6 shows a schematic diagram of an integratable voltage reference generator according to some embodiments.

FIG. 6 shows a schematic diagram of an integratable voltage reference generator 400 according to some embodiments. Voltage reference generator 400 includes an amplifier comprising first stage 420, second stage 440, and third stage 460, and includes a feedback stage 470, which collectively form a feedback loop which causes the voltages and currents of voltage reference generator 400 to generate an output voltage Vref which is stable across variations in certain performance influencing aspects, which may include one or more of manufacturing processing, system power voltage, and circuit temperature.

First stage 420 includes an amplifier having tail current source 422, differential pair transistors 424 and 426, and load current sources 428 and 432. First stage 420 is configured to receive a differential voltage at the gates of differential pair transistors 424 and 426. In addition, first stage 420 is configured to generate a differential current signal for second stage 440 corresponding with the difference between the voltages at the gates of the differential pair transistors 424 and 426.

Second stage 440 includes a first series of Schottky diodes 442, 444, and 446, diode connected transistor 448, transistor 458, and second series of Schottky diodes 452, 454, and 456.

The first series of Schottky diodes 442, 444, and 446 are configured to receive one current signal of the differential current signal generated by first stage 420. First series of Schottky diodes 442, 444, and 446 conducts the received current signal to diode connected transistor 448. The first series of Schottky diodes 442, 444, and 446 also provide a voltage level shift between diode connected transistor 448 and the output of first stage 420.

Diode connected transistor 448 generates a current mirror voltage corresponding with the current signal received from first series of Schottky diodes 442, 444, and 446. In some embodiments, diode connected transistor 448 is cascoded with another transistor (not shown).

Transistor 458 receives the current mirror voltage at its gate and conducts a current corresponding with the current mirror voltage.

The second series of Schottky diodes 452, 454, and 456 are configured to receive the other current signal of the differential current signal generated by first stage 420. Second series of Schottky diodes 452, 454, and 456 conducts the received current signal to transistor 458. The first series of Schottky diodes 442, 444, and 446 also provide a voltage level shift between transistor 458 and the output of first stage 420.

Any difference in the current conducted by transistor 458 and the current conducted by the second series of Schottky diodes 452, 454, and 456 causes the voltage at the drain of transistor 458 to change toward a voltage where the feedback loop causes the current conducted by transistor 458 to be equal to the current conducted by the second series of Schottky diodes 452, 454, and 456.

Third stage 460 includes transistor 462 and load current source 464.

Transistor 462 receives the voltage at the drain of transistor 458 at its gate, and conducts a current corresponding with the received voltage. In addition, transistor 462 receives the current generated by load current source 464. The feedback loop causes the voltage at the gate of transistor 462 to cause the current conducted by transistor 462 to be equal to the current generated by load current source 464. In addition, load current source 464 and transistor 462 collectively generate a voltage for feedback stage 470.

Feedback stage 470 includes a first tract comprising second current mirror transistor 482, resistor 484 and small area Schottky diode 488, and a second tract comprising first current mirror transistor 472, resistor 474, resistor 476, and large area Schottky diode 478.

First current mirror transistor 472 conducts a current based on the voltage at its gate, and that current is conducted by resistor 474, resistor 476, and large area Schottky diode 478 to ground. Similarly, second current mirror transistor 482 conducts a current based on the voltage at its gate, and that current is conducted by resistor 484, and small area Schottky diode 488 to ground.

Resistor 474, resistor 476, and large area Schottky diode 478 collectively generate a voltage at the gate of differential pair transistor 426 based on the current received from first current mirror transistor 472. Similarly, resistor 484, and small area Schottky diode 488 collectively generate a voltage at the gate of differential pair transistor 424 based on the current received from second current mirror transistor 482.

The difference in the voltages at the gates of differential pair transistors 424 and 426 forms a differential feedback signal, and is dependent on the gain of the feedback loop. For the following analysis of the functionality of voltage reference generator 400, the difference in the voltages at the gates of differential pair transistors 424 and 426 is negligible. Accordingly, the voltage drop Vd1 across small area Schottky diode 488 is equal to the sum of the voltage drops across large area Schottky diode 478 and resistor 476.

The voltage across resistor 476 (VR1) is equal to the voltage across small area Schottky diode 488 (Vd1) minus the voltage across large area Schottky diode 478 (VdQ). In addition, $$VR1 = Vd1 - VdQ = nV_t \ln(Q), \text{ where:}$$

n is the ideality factor of the metal-semiconductor junction, $V_t$ is the thermal voltage equal to KT/q, and Q is the area ratio of large area Schottky diode 478 to small area Schottky diode 488.

Furthermore, the current through resistor 476 (IR1) is VR1/R1=(Vd1−VdQ)/R1.

Accordingly, the voltage across resistor 474 (VR2) is IR1×R2=R2/R1×(Vd1−VdQ), and, because Vd1−VdQ=nV$_t$ ln(Q), VR2=R2/R1×nV$_t$ ln(Q).

And, because the voltage across resistor 484=VR2, $$Vref = Vd1 + R2/R1 \times nV_t \ln(Q).$$

The ratio R2/R1 may be called γ, and may be designed to stabilize Vref against temperature variations, and nV$_t$ ln(Q) may be called V$_{PTAT}$, because it is proportional to absolute temperature.

Accordingly, the reference voltage Vref is stable across variations in certain performance influencing aspects, which may include one or more of manufacturing processing, system power voltage, and circuit temperature.

In some embodiments, resistors 474 and 484 are trimmed in a manufacturing process to more precisely control the resistance value R2.

In some embodiments, one or more, or all of current sources 422, 428, 432, and 464 includes a first and second transistors and a resistor connected in series, where the source of the first transistor is connected to the drain of the second transistor and the source of the second transistor is connected to a first terminal of the resistor, where the gate of the first transistor is connected to the source of the second transistor, and where the gate of the second transistor is connected to the second terminal of the resistor. In some embodiments, one or more, or all of current sources 422, 428, 432, and 464 includes a current mirror current source. In some embodiments, one or more, or all of current sources 422, 428, 432, and 464 includes another type of current source.

In some embodiments, one or more or all of the first series of Schottky diodes 442, 444, and 446 is replaced by a diode connected transistor. In some embodiments, one or more or all of the first series of Schottky diodes 442, 444, and 446 is replaced by a resistor. For example, in some embodiments, the first series of Schottky diodes 442, 444, and 446 is replaced by a series of enhancement HEMTs with gate and drain shorted, or with gate and source shorted.

In some embodiments, one or more or all of the second series of Schottky diodes 452, 454, and 456 is replaced by a diode connected transistor. In some embodiments, one or more or all of the second series of Schottky diodes 452, 454, and 456 is replaced by a resistor. For example, in some embodiments, the second series of Schottky diodes 452, 454, and 456 is replaced by a series of enhancement HEMTs with gate and drain shorted, or with gate and source shorted.

In some embodiments, one or more or all of the first series of Schottky diodes 442, 444, and 446 is a Schottky diode similar or identical to Schottky diode 300. In some embodiments, one or more or all of the second series of Schottky diodes 452, 454, and 456 is a Schottky diode similar or identical to Schottky diode 300.

In some embodiments, the semiconductor manufacturing process used to make voltage reference generator 400 is limited to manufacturing transistors which are of the same conductivity type. For example, at least some III-V semiconductor processes, such as GaN, semiconductor processes may be able to feasibly manufacture N-type transistors, and may not feasibly manufacture P-type transistors. In some embodiments, the semiconductor manufacturing process does not manufacture P-type transistors.

Accordingly, the transistors used to form voltage reference generator 400 may be all of the same conductivity type. For example, the transistors used to form voltage reference generator 400 may be all N-type transistors. In some embodiments, all of the transistors used to form voltage reference generator 400 are GaN N-type transistors. In some embodiments, all of the transistors used to form voltage reference generator 400 are GaN N-type HEMT transistors.

Figure 7:
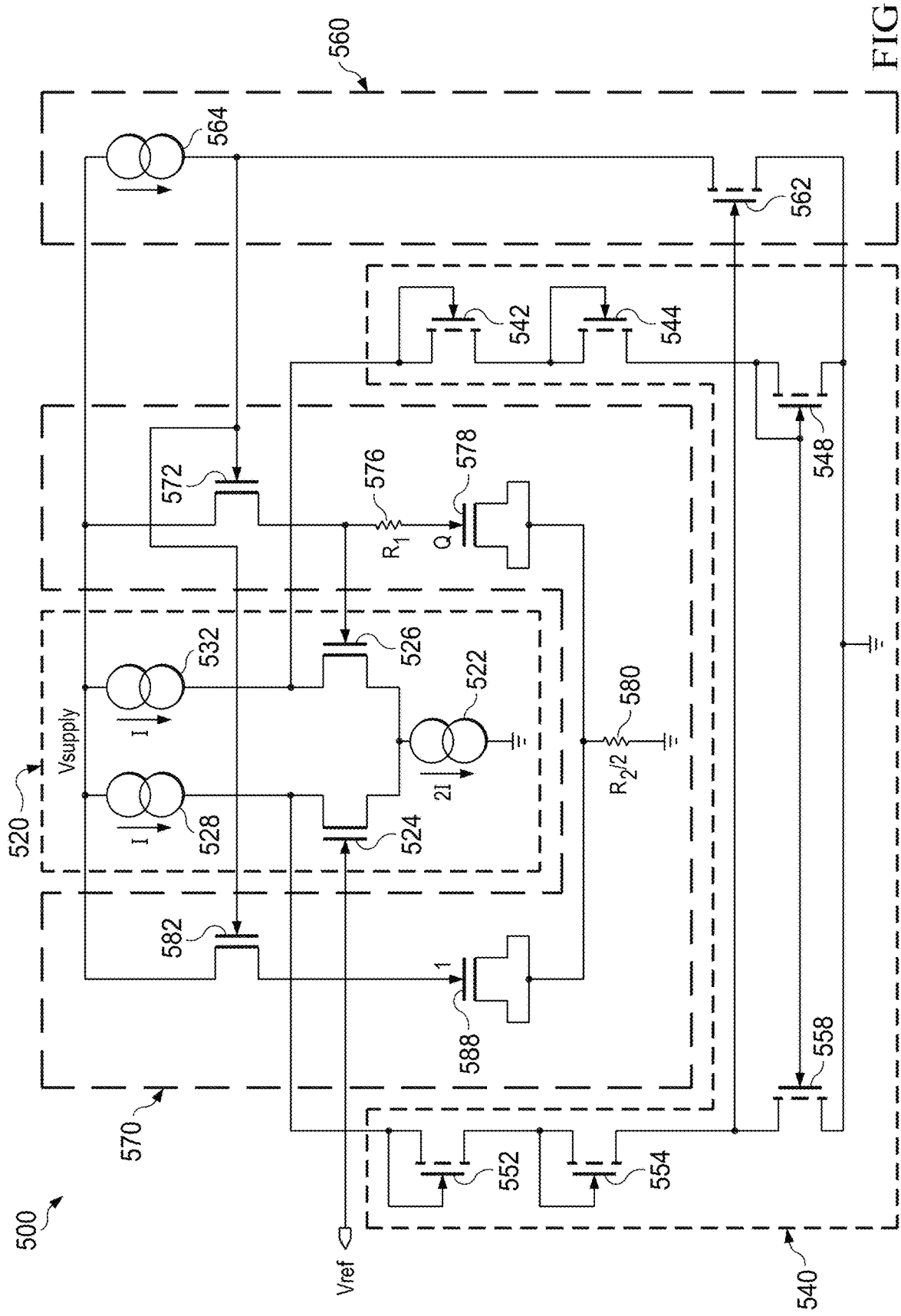
FIG. 7 shows a schematic diagram of an integratable voltage reference generator according to some embodiments.

FIG. 7 shows a schematic diagram of an integratable voltage reference generator 500 according to some embodiments. Voltage reference generator 500 includes an amplifier comprising first stage 520, second stage 540, and third stage 560, and includes a feedback stage 570, which collectively form a feedback loop which causes the voltages and currents of voltage reference generator 500 to generate an output voltage Vref which is stable across variations in certain performance influencing aspects, which may include one or more of manufacturing processing, system power voltage, and circuit temperature.

First stage 520 includes an amplifier having tail current source 522, differential pair transistors 524 and 526, and load current sources 528 and 532. First stage 520 is configured to receive a differential voltage at the gates of differential pair transistors 524 and 526. In addition, first stage 520 is configured to generate a differential current signal for second stage 540 corresponding with the difference between the voltages at the gates of the differential pair transistors 524 and 526.

Second stage 540 includes a first series of diodes 542 and 544, diode connected transistor 548, transistor 558, and second series of diodes 552 and 554.

The first series of diodes 542 and 544 are configured to receive one current signal of the differential current signal generated by first stage 520. First series of diodes 542 and 544 conducts the received current signal to diode connected transistor 548. The first series of diodes 542 and 544 also provide a voltage level shift between diode connected transistor 548 and the output of first stage 520.

Diode connected transistor 548 generates a current mirror voltage corresponding with the current signal received from first series of diodes 542 and 544.

Transistor 558 receives the current mirror voltage at its gate and conducts a current corresponding with the current mirror voltage.

The second series of diodes 552 and 554 are configured to receive the other current signal of the differential current signal generated by first stage 520. Second series of diodes 552 and 554 conducts the received current signal to transistor 558. The first series of diodes 542 and 544 also provides a voltage level shift between transistor 558 and the output of first stage 520.

Any difference in the current conducted by transistor 558 and the current conducted by the second series of diodes 552 and 554 causes the voltage at the drain of transistor 558 to change toward a voltage where the feedback loop causes the current conducted by transistor 558 to be equal to the current conducted by the second series of diodes 552 and 554.

Third stage 560 includes transistor 562 and load current source 564.

Transistor 562 receives the voltage at the drain of transistor 558 at its gate, and conducts a current corresponding with the received voltage. In addition, transistor 562 receives the current generated by load current source 564. The feedback loop causes the voltage at the gate of transistor 562 to cause the current conducted by transistor 562 to be equal to the current generated by load current source 564. In addition, load current source 564 and transistor 562 collectively generate a voltage for feedback stage 570.

Feedback stage 570 includes first tract comprising second current mirror transistor 582 and small area Schottky diode 588, and second tract comprising first current mirror transistor 572, resistor 576, and large area Schottky diode 578.

First current mirror transistor 572 conducts a current based on the voltage at its gate, and that current is conducted by resistor 576, and large area Schottky diode 578 to ground. Similarly, second current mirror transistor 582 conducts a current based on the voltage at its gate, and that current is conducted by small area Schottky diode 588 to ground.

First current mirror transistor 572, resistor 576, and large area Schottky diode 578 collectively generate a voltage at the gate of differential pair transistor 526 based on the current from first current mirror transistor 572. Similarly, second current mirror transistor 582 and small area Schottky diode 588 collectively generate a voltage at the gate of differential pair transistor 524 based on the current from second current mirror transistor 582.

The difference in the voltages at the gates of differential pair transistors 524 and 526 forms a differential feedback signal, and is dependent on the gain of the feedback loop. For the following analysis of the functionality of voltage reference generator 500, the difference in the voltages at the gates of differential pair transistors 524 and 526 is negligible. Accordingly, the voltage drop Vd1 across small area Schottky diode 588 is equal to the sum of the voltage drops across large area Schottky diode 578 and resistor 576.

The voltage across resistor 576 (VR1) is equal to the voltage across small area Schottky diode 588 (Vd1) minus the voltage across large area Schottky diode 578 (VdQ). In addition, $VR1 = Vd1 - VdQ = nV_t \ln(Q)$, where:

n is the ideality factor of the metal-semiconductor junction,
$V_t$ is the thermal voltage equal to KT/q, and
Q is the area ratio of large area Schottky diode 578 to small area Schottky diode 588.

Furthermore, the current through resistor 576 (IR1) is VR1/R1=(Vd1−VdQ)/R1.

In addition, the current through resistor 580 (IR2/2) is 2×IR1=2(Vd1−VdQ)/R1, so the voltage across resistor 580 (VR2/2) is R2/R1×(Vd1−VdQ)=R2/R1×nV$_t$ ln(Q).

Accordingly, Vref=Vd1+R2/R1×nV$_t$ ln(Q).

The ratio R2/R1 may be called γ, and may be designed to stabilize Vref against temperature variations, and nV$_t$ ln(Q) may be called V$_{PTAT}$, because it is proportional to absolute temperature.

Accordingly, the reference voltage Vref is stable across variations in certain performance influencing aspects, which may include one or more of manufacturing processing, system power voltage, and circuit temperature.

In some embodiments, one or more, or all of current sources 522, 528, 532, and 564 includes a first and second transistors and a resistor connected in series, where the source of the first transistor is connected to the drain of the second transistor and the source of the second transistor is connected to a first terminal of the resistor, where the gate of the first transistor is connected to the source of the second transistor, and where the gate of the second transistor is connected to the second terminal of the resistor. In some embodiments, one or more, or all of current sources 522, 528, 532, and 564 includes a current mirror current source.

In some embodiments, one or more, or all of current sources 522, 528, 532, and 564 includes another type of current source.

In some embodiments, one or more or all of the first series of diodes 542 and 544 is replaced by a Schottky diode similar or identical to Schottky diode 300. In some embodiments, one or more or all of the first series of diodes 542 and 544 is replaced by a resistor.

In some embodiments, one or more or all of the second series of diodes 552 and 554 is replaced by a Schottky diode similar or identical to Schottky diode 300. In some embodiments, one or more or all of the second series of diodes 552 and 554 is replaced by a resistor.

In some embodiments, the semiconductor manufacturing process used to make voltage reference generator 500 is limited to manufacturing transistors which are of the same conductivity type. For example, at least some III-V semiconductor processes, such as GaN, semiconductor processes may be able to feasibly manufacture N-type transistors, and may not feasibly manufacture P-type transistors. In some embodiments, the semiconductor manufacturing process does not manufacture P-type transistors.

Accordingly, the transistors used to form voltage reference generator 500 may be all of the same conductivity type. For example, the transistors used to form voltage reference generator 500 may be all N-type transistors. In some embodiments, all of the transistors used to form voltage reference generator 500 are GaN N-type transistors. In some embodiments, all of the transistors used to form voltage reference generator 500 are GaN N-type HEMT transistors.

Figure 8:
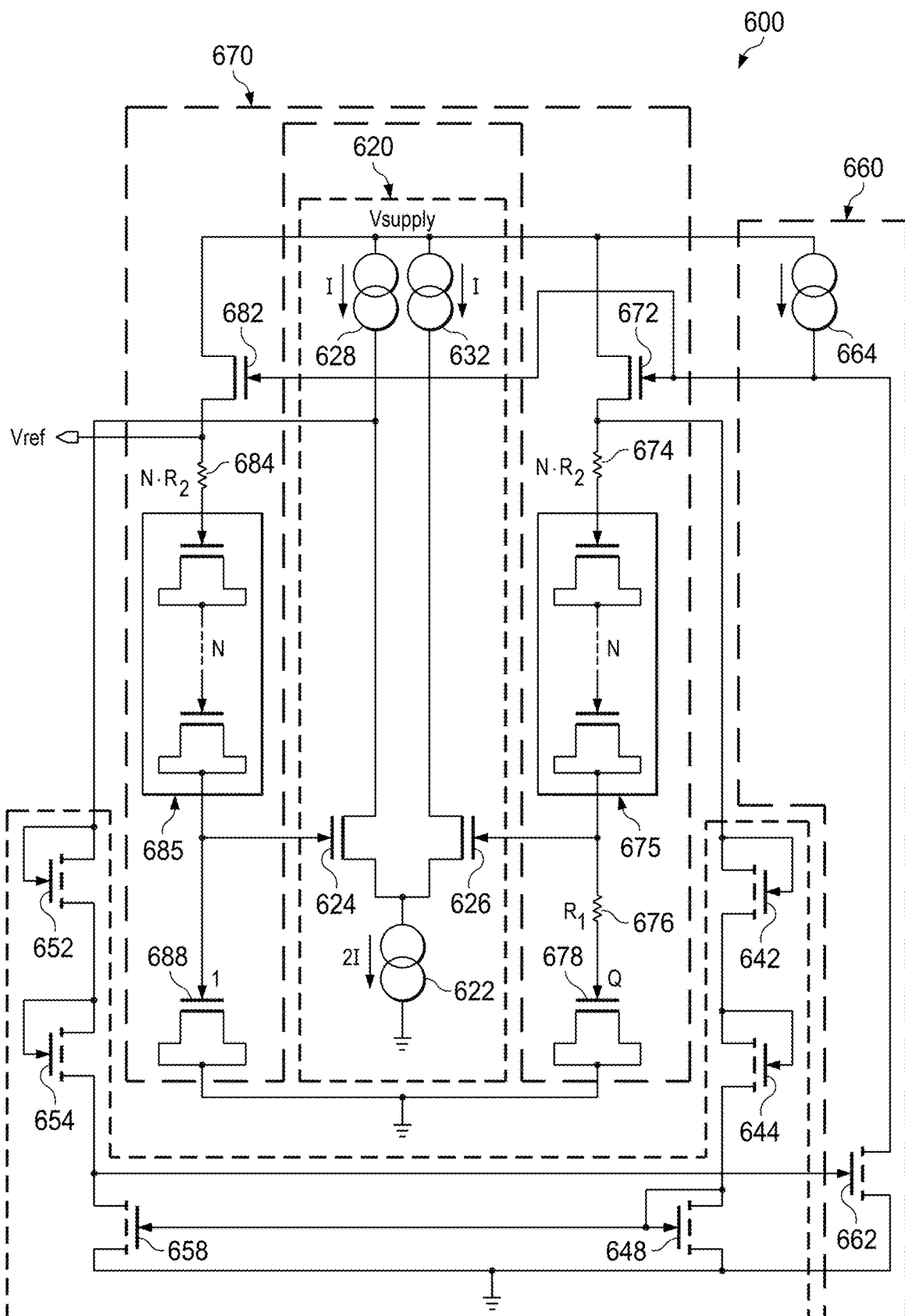
FIG. 8 shows a schematic diagram of an integratable voltage reference generator according to some embodiments.

FIG. 8 shows a schematic diagram of an integratable voltage reference generator 600 according to some embodiments. Voltage reference generator 600 includes an amplifier comprising first stage 620, second stage 640, and third stage 660, and includes a feedback stage 670, which collectively form a feedback loop which causes the voltages and currents of voltage reference generator 600 to generate an output voltage Vref which is stable across variations in certain performance influencing aspects, which may include one or more of manufacturing processing, system power voltage, and circuit temperature.

First stage 620 includes an amplifier having tail current source 622, differential pair transistors 624 and 626, and load current sources 628 and 632. First stage 620 is configured to receive a differential voltage at the gates of differential pair transistors 624 and 626. In addition, first stage 620 is configured to generate a differential current signal for second stage 640 corresponding with the difference between the voltages at the gates of the differential pair transistors 624 and 626.

Second stage 640 includes a first series of diodes 642 and 644, diode connected transistor 648, transistor 658, and second series of diodes 652 and 654.

The first series of diodes 642 and 644 are configured to receive one current signal of the differential current signal generated by first stage 620. First series of diodes 642 and 644 conducts the received current signal to diode connected transistor 648. The first series of diodes 642 and 644 also provide a voltage level shift between diode connected transistor 648 and the output of first stage 620.

Diode connected transistor 648 generates a current mirror voltage corresponding with the current signal received from first series of diodes 642 and 644.

Transistor 658 receives the current mirror voltage at its gate and conducts a current corresponding with the current mirror voltage.

The second series of diodes 652 and 654 are configured to receive the other current signal of the differential current signal generated by first stage 620. Second series of diodes 652 and 654 conducts the received current signal to transistor 658. The first series of diodes 642 and 644 also provides a voltage level shift between transistor 658 and the output of first stage 620.

Any difference in the current conducted by transistor 658 and the current conducted by the second series of diodes 652 and 654 causes the voltage at the drain of transistor 658 to change toward a voltage where the feedback loop causes the current conducted by transistor 658 to be equal to the current conducted by the second series of diodes 652 and 654.

Third stage 660 includes transistor 662 and load current source 664.

Transistor 662 receives the voltage at the drain of transistor 658 at its gate, and conducts a current corresponding with the received voltage. In addition, transistor 662 receives the current generated by load current source 664. The feedback loop causes the voltage at the gate of transistor 662 to cause the current conducted by transistor 662 to be equal to the current generated by load current source 664. In addition, load current source 664 and transistor 662 collectively generate a voltage for feedback stage 670.

Feedback stage 670 includes a first tract comprising second current mirror transistor 682, resistor 684, Schottky diode series 685, and small area Schottky diode 688, and second tract comprising first current mirror transistor 672, resistor 674, Schottky diode series 675, resistor 676, and large area Schottky diode 678.

First current mirror transistor 672 conducts a current based on the voltage at its gate, and that current is conducted by resistor 674, Schottky diode series 675, resistor 676, and large area Schottky diode 678 to ground. Similarly, second current mirror transistor 682 conducts a current based on the voltage at its gate, and that current is conducted by resistor 684, Schottky diode series 685, and small area Schottky diode 688 to ground.

Resistor 674, Schottky diode series 675, resistor 676, and large area Schottky diode 678 collectively generate a voltage at the gate of differential pair transistor 626 based on the current received from first current mirror transistor 672. Similarly, resistor 684, Schottky diode series 685, and small area Schottky diode 688 collectively generate a voltage at the gate of differential pair transistor 624 based on the current received from second current mirror transistor 682.

The difference in the voltages at the gates of differential pair transistors 624 and 626 forms a differential feedback signal, and is dependent on the gain of the feedback loop. For the following analysis of the functionality of voltage reference generator 600, the difference in the voltages at the gates of differential pair transistors 624 and 626 is negligible. Accordingly, the voltage drop Vd1 across small area Schottky diode 688 is equal to the sum of the voltage drops across large area Schottky diode 678 and resistor 676.

The voltage across resistor 676 (VR1) is equal to the voltage across small area Schottky diode 688 (Vd1) minus the voltage across large area Schottky diode 678 (VdQ). In addition, $$VR1 = Vd1 - VdQ = nV_t \ln(Q), \text{ where:}$$

n is the ideality factor of the metal-semiconductor junction, $V_t$ is the thermal voltage equal to KT/q, and Q is the area ratio of large area Schottky diode 678 to small area Schottky diode 688.

Furthermore, the current through resistor 676 (IR1) is VR1/R1=(Vd1−VdQ)/R1.

Accordingly, the voltage across resistor 674 (VR2) is IR1×N×R2=N×R2/R1×(Vd1−VdQ), and, because Vd1−VdQ=$nV_t \ln(Q)$, VR2=N×R2/R1×$nV_t \ln(Q)$.

And, because the voltage across resistor 684=VR2 and the voltage across each of the N diodes of Schottky diode series 685 is equal to Vd1, Vref=Vd1+N×Vd1+N×R2/R1×$nV_t \ln(Q)$. Accordingly, the value of Vref may be scaled by scaling the value N.

The ratio R2/R1 may be called γ, and may be designed to stabilize Vref against temperature variations, and $nV_t \ln(Q)$ may be called $V_{PTAT}$, because it is proportional to absolute temperature.

Accordingly, the reference voltage Vref is stable across variations in certain performance influencing aspects, which may include one or more of manufacturing processing, system power voltage, and circuit temperature, and is N×higher than if Schottky diode series 685 and 675 were not used and resistors 684 and 674 had a value of R2 instead of N×R2.

In some embodiments, one or more, or all of current sources 622, 628, 632, and 664 includes a first and second transistors and a resistor connected in series, where the source of the first transistor is connected to the drain of the second transistor and the source of the second transistor is connected to a first terminal of the resistor, where the gate of the first transistor is connected to the source of the second transistor, and where the gate of the second transistor is connected to the second terminal of the resistor. In some embodiments, one or more, or all of current sources 622, 628, 632, and 664 includes a current mirror current source. In some embodiments, one or more, or all of current sources 622, 628, 632, and 664 includes another type of current source.

In some embodiments, one or more or all of the first series of diodes 642 and 644 is replaced by a Schottky diode similar or identical to Schottky diode 300. In some embodiments, one or more or all of the first series of diodes 642 and 644 is replaced by a resistor.

In some embodiments, one or more or all of the second series of diodes 652 and 654 is replaced by a Schottky diode similar or identical to Schottky diode 300. In some embodiments, one or more or all of the second series of diodes 652 and 654 is replaced by a resistor.

In some embodiments, the semiconductor manufacturing process used to make voltage reference generator 600 is limited to manufacturing transistors which are of the same conductivity type. For example, at least some III-V semiconductor processes, such as GaN, semiconductor processes may be able to feasibly manufacture N-type transistors, and may not feasibly manufacture P-type transistors. In some embodiments, the semiconductor manufacturing process does not manufacture P-type transistors.

Accordingly, the transistors used to form voltage reference generator 600 may be all of the same conductivity type. For example, the transistors used to form voltage reference generator 600 may be all N-type transistors. In some embodiments, all of the transistors used to form voltage reference generator 600 are GaN N-type transistors. In some embodiments, all of the transistors used to form voltage reference generator 600 are GaN N-type HEMT transistors.

Figure 9:
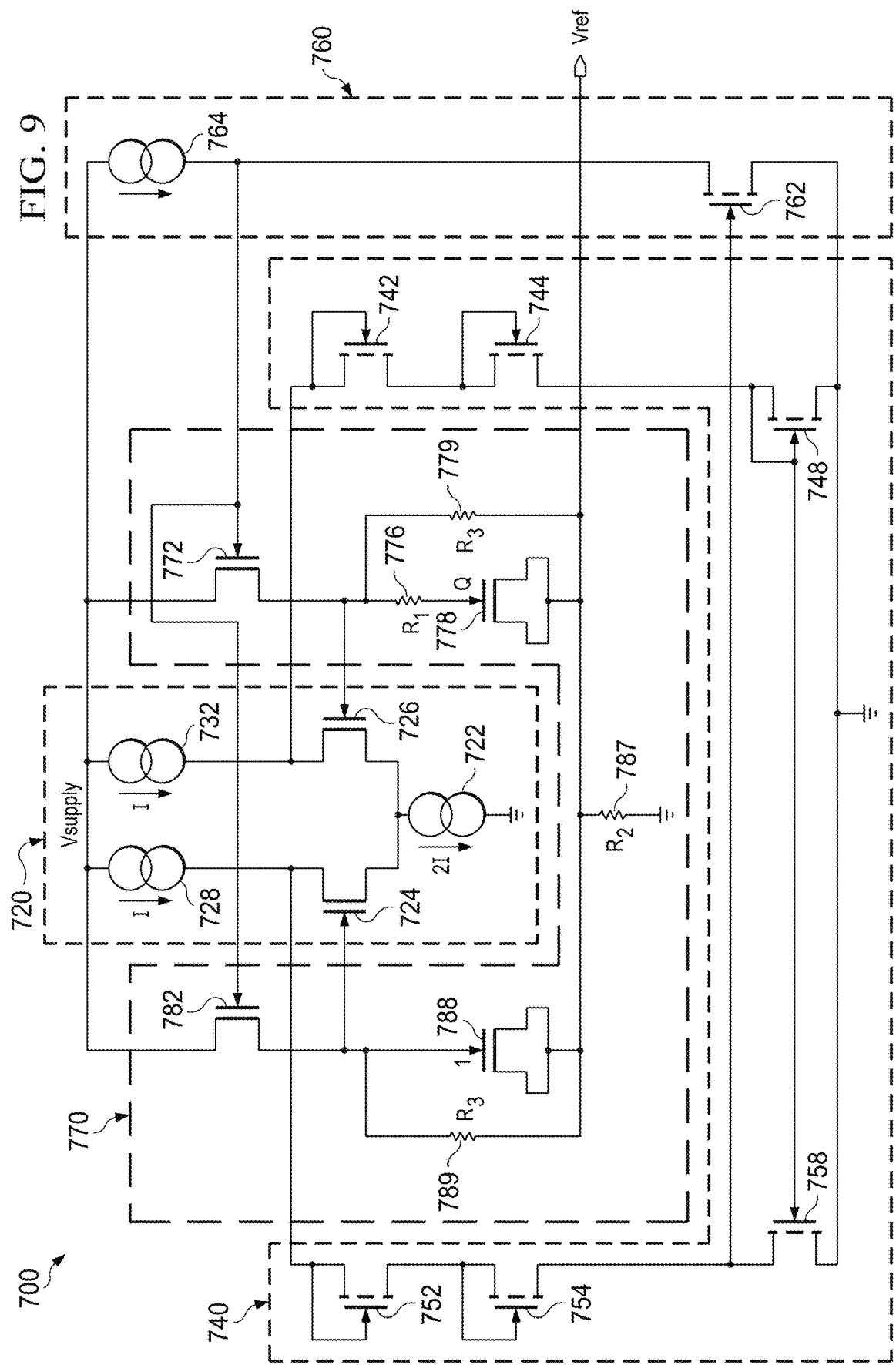
FIG. 9 shows a schematic diagram of an integratable voltage reference generator according to some embodiments.

FIG. 9 shows a schematic diagram of an integratable voltage reference generator 700 according to some embodiments. Voltage reference generator 700 includes an amplifier comprising first stage 720, second stage 740, and third stage 760, and includes a feedback stage 770, which collectively form a feedback loop which causes the voltages and currents of voltage reference generator 700 to generate an output voltage Vref which is stable across variations in certain performance influencing aspects, which may include one or more of manufacturing processing, system power voltage, and circuit temperature.

First stage 720 includes an amplifier having tail current source 722, differential pair transistors 724 and 726, and load current sources 728 and 732. First stage 720 is configured to receive a differential voltage at the gates of differential pair transistors 724 and 726. In addition, first stage 720 is configured to generate a differential current signal for second stage 740 corresponding with the difference between the voltages at the gates of the differential pair transistors 724 and 726.

Second stage 740 includes a first series of diodes 742 and 744, diode connected transistor 748, transistor 758, and second series of diodes 752 and 754.

The first series of diodes 742 and 744 are configured to receive one current signal of the differential current signal generated by first stage 720. First series of diodes 742 and 744 conducts the received current signal to diode connected transistor 748. The first series of diodes 742 and 744 also provide a voltage level shift between diode connected transistor 748 and the output of first stage 720.

Diode connected transistor 748 generates a current mirror voltage corresponding with the current signal received from first series of diodes 742 and 744.

Transistor 758 receives the current mirror voltage at its gate and conducts a current corresponding with the current mirror voltage.

The second series of diodes 752 and 754 are configured to receive the other current signal of the differential current signal generated by first stage 720. Second series of diodes 752 and 754 conducts the received current signal to transistor 758. The first series of diodes 742 and 744 also provides a voltage level shift between transistor 758 and the output of first stage 720.

Any difference in the current conducted by transistor 758 and the current conducted by the second series of diodes 752 and 754 causes the voltage at the drain of transistor 758 to change toward a voltage where the feedback loop causes the current conducted by transistor 758 to be equal to the current conducted by the second series of diodes 752 and 754.

Third stage 760 includes transistor 762 and load current source 764.

Transistor 762 receives the voltage at the drain of transistor 758 at its gate, and conducts a current corresponding with the received voltage. In addition, transistor 762 receives the current generated by load current source 764. The feedback loop causes the voltage at the gate of transistor 762 to cause the current conducted by transistor 762 to be equal to the current generated by load current source 764. In addition, load current source 764 and transistor 762 collectively generate a voltage for feedback stage 770.

Feedback stage 770 includes a first tract comprising second current mirror transistor 782, small area Schottky diode 788, and resistor 789, and second tract comprising first current mirror transistor 772, resistor 776, large area Schottky diode 778, and resistor 779.

First current mirror transistor 772 conducts a current based on the voltage at its gate, and that current is conducted by resistor 776, and large area Schottky diode 778 to ground. Similarly, second current mirror transistor 782 conducts a current based on the voltage at its gate, and that current is conducted by small area Schottky diode 788 to ground.

First current mirror transistor 772, resistor 776, large area Schottky diode 778, and resistor 779 collectively generate a voltage at the gate of differential pair transistor 726 based on the current from first current mirror transistor 772. Similarly, second current mirror transistor 782, small area Schottky diode 788, and resistor 489 collectively generate a voltage at the gate of differential pair transistor 724 based on the current from second current mirror transistor 782.

The difference in the voltages at the gates of differential pair transistors 724 and 726 forms a differential feedback signal, and is dependent on the gain of the feedback loop. For the following analysis of the functionality of voltage reference generator 700, the difference in the voltages at the gates of differential pair transistors 724 and 726 is negligible. Accordingly, the voltage drop Vd1 across small area Schottky diode 788 is equal to the sum of the voltage drops across large area Schottky diode 778 and resistor 776.

The voltage across resistor 776 (VR1) is equal to the voltage across small area Schottky diode 788 (Vd1) minus the voltage across large area Schottky diode 778 (VdQ). In addition, $$VR1 = Vd1 - VdQ = nV_t \ln(Q), \text{ where:}$$

n is the ideality factor of the metal-semiconductor junction, $V_t$ is the thermal voltage equal to KT/q, and Q is the area ratio of large area Schottky diode 778 to small area Schottky diode 788.

Furthermore, the current through resistor 776 (IR1) is VR1/R1=(Vd1−VdQ)/R1.

In addition, the current through resistor 780 (IR2)=2× IR1+2×(Vd1−Vref)/R3=2×(Vd1−VdQ)+2×(Vd1−Vref)/R3=2(nV$_t$ ln(Q))/R1+2×(Vd1−Vref)/R3, and $$Vref = [2R2R3/(R3+2R2)] \times (Vd1/R3 + nV_t \ln(Q)/R1).$$

Accordingly, where R3>>R2, Vref=2×R2(Vd1/R3+nV$_t$ ln(Q)/R1).

Therefore, R1 can be determined to set the bias current of the large area Schottky diode 778 and small area Schottky diode 788, R3 can be determined to minimize the temperature dependence of Vref, R2 can be determined to adjust the value of Vref, and nV$_t$ ln(Q) may be called $V_{PTAT}$, because it is proportional to absolute temperature.

Accordingly, the reference voltage Vref is stable across variations in certain performance influencing aspects, which may include one or more of manufacturing processing, system power voltage, and circuit temperature.

In some embodiments, one or more, or all of current sources 722, 728, 732, and 764 includes a first and second transistors and a resistor connected in series, where the source of the first transistor is connected to the drain of the second transistor and the source of the second transistor is connected to a first terminal of the resistor, where the gate of the first transistor is connected to the source of the second transistor, and where the gate of the second transistor is connected to the second terminal of the resistor. In some embodiments, one or more, or all of current sources 722, 728, 732, and 764 includes a current mirror current source. In some embodiments, one or more, or all of current sources 722, 728, 732, and 764 includes another type of current source.

In some embodiments, one or more or all of the first series of diodes 742 and 744 is replaced by a Schottky diode similar or identical to Schottky diode 300. In some embodiments, one or more or all of the first series of diodes 742 and 744 is replaced by a resistor.

In some embodiments, one or more or all of the second series of diodes 752 and 754 is replaced by a Schottky diode similar or identical to Schottky diode 300. In some embodiments, one or more or all of the second series of diodes 752 and 754 is replaced by a resistor.

In some embodiments, the semiconductor manufacturing process used to make voltage reference generator 700 is limited to manufacturing transistors which are of the same conductivity type. For example, at least some III-V semiconductor processes, such as GaN, semiconductor processes may be able to feasibly manufacture N-type transistors, and may not feasibly manufacture P-type transistors. In some embodiments, the semiconductor manufacturing process does not manufacture P-type transistors.

Accordingly, the transistors used to form voltage reference generator 700 may be all of the same conductivity type. For example, the transistors used to form voltage reference generator 700 may be all N-type transistors. In some embodiments, all of the transistors used to form voltage reference generator 700 are GaN N-type transistors. In some embodiments, all of the transistors used to form voltage reference generator 700 are GaN N-type HEMT transistors.

Figure 10:
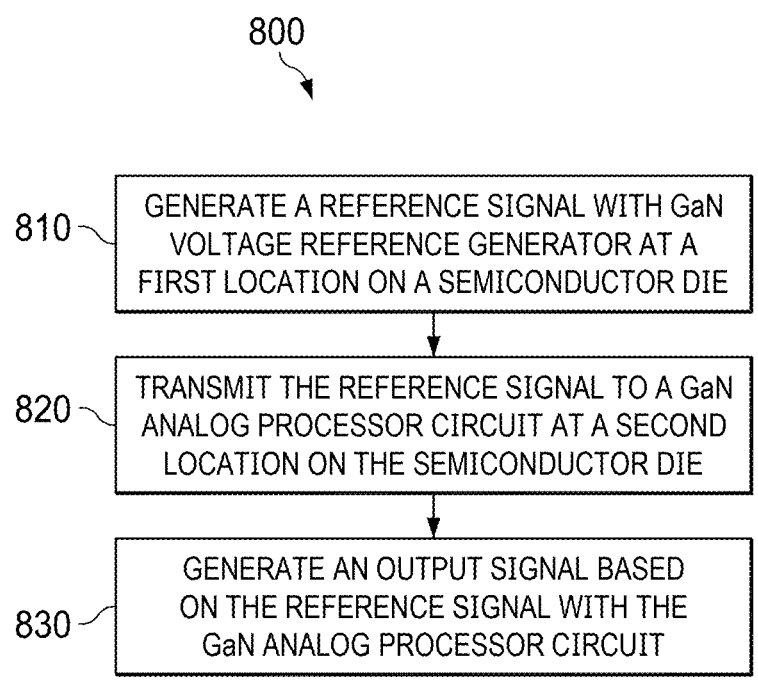
FIG. 10 shows a schematic flowchart diagram of a method of using an electronic system according to some embodiments.

FIG. 10 shows a schematic flowchart diagram of a method 800 of using an electronic system according to some embodiments. Method 800 may be performed, for example by electronic system 100 or 200.

At 810, a voltage reference generator, such as voltage reference generator 110 or 210 generates a reference signal, such as a reference voltage. The voltage reference generator may be formed with a III-V semiconductor process, such as a GaN semiconductor process by manufacturing III-V transistors at a first area on a III-V semiconductor die.

At 820, the reference signal is transmitted to an analog circuit, such as a converter circuit, such as analog circuit 130 or DC-DC converter 230. The analog circuit may be formed with the III-V semiconductor process used to form the voltage reference generator. For example, the analog circuit and the voltage reference generator may be formed in parallel at different areas on the same III-V semiconductor die, where each successive processing step forms a next portion of each of the analog circuit and the voltage reference generator.

At 830, the analog circuit generates an output based on the reference signal generated by the voltage reference generator.

Examples of the present invention are summarized here. Other examples can also be understood from the entirety of the specification and the claims.

Example 1 Another embodiment is an electronic system, including a Gallium Nitride (GaN) semiconductor die and further including, entirely disposed on the GaN semiconductor die i) a voltage reference circuit including GaN semiconductor transistors, the voltage reference circuit configured to generate a reference voltage, and ii) an electronic component including GaN semiconductor transistors and configured to generate a power output based on the reference voltage, where the voltage reference circuit includes an amplifier including GaN semiconductor transistors, the amplifier including a first and a second input terminal and an output terminal; a feedback stage including a first tract including a first GaN HEMT including a respective gate, source, and drain terminal, where the first GaN HEMT is connected to the first input terminal of the amplifier; a second tract including a resistor connected, at a first end of the resistor, to the second input terminal of the amplifier; and a second GaN HEMT including a respective gate, source and drain terminal, where the second HEMT is connected to a second end of the resistor, where the second HEMT has an area which is Q times a respective area of the first HEMT, where Q is greater than 1, where the first and second tracts are configured to respectively generate a first and second voltage at the first and second input terminal of the amplifier, respectively, where the amplifier is configured to generate, at the output terminal, an amplifier voltage based on the first and second voltages, where the feedback stage is configured to generate the reference voltage based on the amplifier voltage, and where the reference voltage is a function of the area of the first and second HEMTs and a value of the resistor.

Example 2 The electronic system of any of the preceding examples, where the reference voltage is a function of a ratio of the resistor and a second resistor and is a function of a ratio of the area of the first and second HEMTs.

Example 3 The electronic system of any of the preceding examples, where the first and second HEMTs are depletion mode HEMTs.

Example 4 The electronic system of any of the preceding examples, where the first and second HEMTs each include a metal gate structure contacting an AlGaN layer.

Example 5 The electronic system of any of the preceding examples, where the reference voltage is a voltage at one of the first and second input terminals of the amplifier.

Example 6 The electronic system of any of the preceding examples, further including a second resistor having a first end connected to the first input terminal of the amplifier and a second end connected to the second GaN HEMT; and a third resistor having a first end connected to the first input terminal of the amplifier.

Example 7 The electronic system of any of the preceding examples, where the reference voltage is a voltage at the second end of one of the first and second resistors.

Example 8 The electronic system of any of the preceding examples, further including one or more third diodes connected between the first resistor and the second input terminal of the amplifier, where the first end of the second resistor is connected to the first input terminal of the amplifier by the one or more third diodes; and one or more fourth diodes connected between the second resistor and the first input terminal of the amplifier, where the first end of the second resistor is connected to the first input terminal of the amplifier by the one or more fourth diodes, where the reference voltage is a voltage at a second end of one of the first and second resistors.

Example 9 The electronic system of any of the preceding examples, further including
a second resistor having a first end connected to the first and second GaN HEMTs and a second end connected to the first input terminal of the amplifier;
a third resistor having a first end connected to the first and second GaN HEMTs and a second end connected to the second input terminal of the amplifier; and
a fourth resistor having a first end connected to the first and second GaN HEMTs,
where the reference voltage is a voltage at a node to which the first and second GaN HEMTs are connected.

Example 10 Another embodiment is a method of forming an electronic system, the method including providing a Gallium Nitride (GaN) semiconductor die; forming a voltage reference circuit including GaN semiconductor transistors on the GaN semiconductor die, the voltage reference circuit configured to generate a reference voltage, and forming an electronic component including GaN semiconductor transistors on the GaN semiconductor die, the electronic component configured to generate a power output based on the reference voltage, where the voltage reference circuit includes an amplifier including GaN semiconductor transistors, the amplifier including a first and a second input terminal and an output terminal; a feedback stage including a first tract including a first GaN HEMT including a respective gate, source, and drain terminal, where the first GaN HEMT is connected to the first input terminal of the amplifier; a second tract including a resistor connected, at a first end of the resistor, to the second input terminal of the amplifier; and a second GaN HEMT including a respective gate, source and drain terminal, where the second HEMT is connected to a second end of the resistor, where the second HEMT has an area which is Q times a respective area of the first HEMT, where Q is greater than 1, where the first and second tracts are configured to respectively generate a first and second voltage at the first and second input terminal of the amplifier, respectively, where the amplifier is configured to generate, at the output terminal, an amplifier voltage based on the first and second voltages, where the feedback stage is configured to generate the reference voltage based on the amplifier voltage, and where the reference voltage is a function of the area of the first and second HEMTs and a value of the resistor.

Example 11 The method of any of the preceding examples, where the reference voltage is a function of a ratio of the resistor and a second resistor and is a function of a ratio of the area of the first and second HEMTs.

Example 12 The method of any of the preceding examples, where the first and second HEMTs each include a metal gate structure contacting an AlGaN layer.

Example 13 The method of any of the preceding examples, where the reference voltage is a voltage at one of the first and second input terminals of the amplifier.

Example 14 The method of any of the preceding examples, further including forming a second resistor having a first end connected to the first input terminal of the amplifier and a second end connected to the second GaN HEMT; and forming a third resistor having a first end connected to the first input terminal of the amplifier.

Example 15 The method of any of the preceding examples, where the reference voltage is a voltage at the second end of one of the first and second resistors.

Example 16 The method of any of the preceding examples, further including forming one or more third diodes connected between the first resistor and the second input terminal of the amplifier, where the first end of the second resistor is connected to the first input terminal of the amplifier by the one or more third diodes; and forming one or more fourth diodes connected between the second resistor and the first input terminal of the amplifier, where the first end of the second resistor is connected to the first input terminal of the amplifier by the one or more fourth diodes, where the reference voltage is a voltage at a second end of one of the first and second resistors.

Example 17 The method of any of the preceding examples, further including forming a second resistor having a first end connected to the first and second GaN HEMTs and a second end connected to the first input terminal of the amplifier; forming a third resistor having a first end connected to the first and second GaN HEMTs and a second end connected to the second input terminal of the amplifier; and forming a fourth resistor having a first end connected to the first and second GaN HEMTs, where the reference voltage is a voltage at a node to which the first and second GaN HEMTs are connected.

Example 18 Another embodiment is an electronic system, including a Gallium Nitride (GaN) semiconductor die and further including, entirely disposed on the GaN semiconductor die a voltage reference circuit including GaN semiconductor transistors, the voltage reference circuit configured to generate a reference voltage, and the voltage reference circuit including an amplifier including GaN semiconductor transistors, the amplifier including a first and a second input terminal and an output terminal; a feedback stage including a first tract including a first GaN HEMT including a respective gate, source, and drain terminal, where the first GaN HEMT is connected to the first input terminal of the amplifier; a second tract including a resistor connected, at a first end of the resistor, to the second input terminal of the amplifier; and a second GaN HEMT including a respective gate, source and drain terminal, where the second HEMT is connected to a second end of the resistor, where the second HEMT has an area which is Q times a respective area of the first HEMT, where Q is greater than 1, where the first and second tracts are configured to respectively generate a first and second voltage at the first and second input terminal of the amplifier, respectively, where the amplifier is configured to generate, at the output terminal, an amplifier voltage based on the first and second voltages, where the feedback stage is configured to generate the reference voltage based on the amplifier voltage, and where the reference voltage is a function of the area of the first and second HEMTs and a value of the resistor.

Example 19 The electronic system of any of the preceding examples, where the reference voltage is a function of a ratio of the resistor and a second resistor and is a function of a ratio of the area of the first and second HEMTs.

Example 20 The electronic system of any of the preceding examples, where the first and second HEMTs each include a metal gate structure contacting an AlGaN layer.

What is claimed is:

1. An electronic system, comprising a Gallium Nitride (GaN) semiconductor die and further comprising, entirely disposed on the GaN semiconductor die:
    a voltage reference circuit comprising GaN semiconductor transistors, the voltage reference circuit configured to generate a reference voltage, and
    an electronic component comprising GaN semiconductor transistors and configured to generate a power output based on the reference voltage,
wherein the voltage reference circuit comprises:
    an amplifier comprising GaN semiconductor transistors, the amplifier comprising a first and a second input terminal and an output terminal;
    a feedback stage comprising:
        a first tract comprising a first GaN HEMT comprising a respective gate, source, and drain terminal, wherein the first GaN HEMT is connected to the first input terminal of the amplifier;
        a second tract comprising:
            a resistor connected, at a first end of the resistor, to the second input terminal of the amplifier; and
            a second GaN HEMT comprising a respective gate, source and drain terminal, wherein the second HEMT is connected to a second end of the resistor, wherein the second HEMT has an area which is Q times a respective area of the first HEMT, wherein Q is greater than 1,
        wherein the first and second tracts are configured to respectively generate a first and second voltage at the first and second input terminal of the amplifier, respectively,
    wherein the amplifier is configured to generate, at the output terminal, an amplifier voltage based on the first and second voltages,
    wherein the feedback stage is configured to generate the reference voltage based on the amplifier voltage, and
    wherein the reference voltage is a function of the area of the first and second HEMTs and a value of the resistor.

2. The electronic system of claim 1, wherein the reference voltage is a function of a ratio of the resistor and a second resistor and is a function of a ratio of the area of the first and second HEMTs.

3. The electronic system of claim 1, wherein the first and second HEMTs are depletion mode HEMTs.

4. The electronic system of claim 1, wherein the first and second HEMTs each comprise a metal gate structure contacting an AlGaN layer.

5. The electronic system of claim 1, wherein the reference voltage is a voltage at one of the first and second input terminals of the amplifier.

6. The electronic system of claim 1, further comprising:
    a second resistor having a first end connected to the first input terminal of the amplifier and a second end connected to the second GaN HEMT; and
    a third resistor having a first end connected to the first input terminal of the amplifier.

7. The electronic system of claim 6, wherein the reference voltage is a voltage at the second end of one of the first and second resistors.

8. The electronic system of claim 6, further comprising:
    one or more third diodes connected between the first resistor and the second input terminal of the amplifier, wherein the first end of the second resistor is connected to the first input terminal of the amplifier by the one or more third diodes; and
    one or more fourth diodes connected between the second resistor and the first input terminal of the amplifier, wherein the first end of the second resistor is connected to the first input terminal of the amplifier by the one or more fourth diodes,
    wherein the reference voltage is a voltage at a second end of one of the first and second resistors.

9. The electronic system of claim 1, further comprising
    a second resistor having a first end connected to the first and second GaN HEMTs and a second end connected to the first input terminal of the amplifier;
    a third resistor having a first end connected to the first and second GaN HEMTs and a second end connected to the second input terminal of the amplifier; and
    a fourth resistor having a first end connected to the first and second GaN HEMTs,
    wherein the reference voltage is a voltage at a node to which the first and second GaN HEMTs are connected.

10. A method of forming an electronic system, the method comprising:
    providing a Gallium Nitride (GaN) semiconductor die;
    forming a voltage reference circuit comprising GaN semiconductor transistors on the GaN semiconductor die, the voltage reference circuit configured to generate a reference voltage, and
    forming an electronic component comprising GaN semiconductor transistors on the GaN semiconductor die, the electronic component configured to generate a power output based on the reference voltage, wherein the voltage reference circuit comprises:
an amplifier comprising GaN semiconductor transistors, the amplifier comprising a first and a second input terminal and an output terminal;
a feedback stage comprising:
a first tract comprising a first GaN HEMT comprising a respective gate, source, and drain terminal, wherein the first GaN HEMT is connected to the first input terminal of the amplifier;
a second tract comprising:
a resistor connected, at a first end of the resistor, to the second input terminal of the amplifier; and
a second GaN HEMT comprising a respective gate, source and drain terminal, wherein the second HEMT is connected to a second end of the resistor,
wherein the second HEMT has an area which is Q times a respective area of the first HEMT, wherein Q is greater than 1,
wherein the first and second tracts are configured to respectively generate a first and second voltage at the first and second input terminal of the amplifier, respectively,
wherein the amplifier is configured to generate, at the output terminal, an amplifier voltage based on the first and second voltages,
wherein the feedback stage is configured to generate the reference voltage based on the amplifier voltage, and
wherein the reference voltage is a function of the area of the first and second HEMTs and a value of the resistor.

11. The method of claim 10, wherein the reference voltage is a function of a ratio of the resistor and a second resistor and is a function of a ratio of the area of the first and second HEMTs.

12. The method of claim 10, wherein the first and second HEMTs each comprise a metal gate structure contacting an AlGaN layer.

13. The method of claim 10, wherein the reference voltage is a voltage at one of the first and second input terminals of the amplifier.

14. The method of claim 10, further comprising:
forming a second resistor having a first end connected to the first input terminal of the amplifier and a second end connected to the second GaN HEMT; and
forming a third resistor having a first end connected to the first input terminal of the amplifier.

15. The method of claim 14, wherein the reference voltage is a voltage at the second end of one of the first and second resistors.

16. The method of claim 14, further comprising:
forming one or more third diodes connected between the first resistor and the second input terminal of the amplifier, wherein the first end of the second resistor is connected to the first input terminal of the amplifier by the one or more third diodes; and
forming one or more fourth diodes connected between the second resistor and the first input terminal of the amplifier, wherein the first end of the second resistor is connected to the first input terminal of the amplifier by the one or more fourth diodes,
wherein the reference voltage is a voltage at a second end of one of the first and second resistors.

17. The method of claim 10, further comprising:
forming a second resistor having a first end connected to the first and second GaN HEMTs and a second end connected to the first input terminal of the amplifier;
forming a third resistor having a first end connected to the first and second GaN HEMTs and a second end connected to the second input terminal of the amplifier; and
forming a fourth resistor having a first end connected to the first and second GaN HEMTs,
wherein the reference voltage is a voltage at a node to which the first and second GaN HEMTs are connected.

18. An electronic system, comprising a Gallium Nitride (GaN) semiconductor die and further comprising, entirely disposed on the GaN semiconductor die a voltage reference circuit comprising GaN semiconductor transistors, the voltage reference circuit configured to generate a reference voltage, and the voltage reference circuit comprising:
an amplifier comprising GaN semiconductor transistors, the amplifier comprising a first and a second input terminal and an output terminal;
a feedback stage comprising:
a first tract comprising a first GaN HEMT comprising a respective gate, source, and drain terminal, wherein the first GaN HEMT is connected to the first input terminal of the amplifier;
a second tract comprising:
a resistor connected, at a first end of the resistor, to the second input terminal of the amplifier; and
a second GaN HEMT comprising a respective gate, source and drain terminal, wherein the second HEMT is connected to a second end of the resistor,
wherein the second HEMT has an area which is Q times a respective area of the first HEMT, wherein Q is greater than 1,
wherein the first and second tracts are configured to respectively generate a first and second voltage at the first and second input terminal of the amplifier, respectively,
wherein the amplifier is configured to generate, at the output terminal, an amplifier voltage based on the first and second voltages,
wherein the feedback stage is configured to generate the reference voltage based on the amplifier voltage, and
wherein the reference voltage is a function of the area of the first and second HEMTs and a value of the resistor.

19. The electronic system of claim 18, wherein the reference voltage is a function of a ratio of the resistor and a second resistor and is a function of a ratio of the area of the first and second HEMTs.

20. The electronic system of claim 18, wherein the first and second HEMTs each comprise a metal gate structure contacting an AlGaN layer.

* * * * *